US011456185B2

(12) United States Patent
Burns et al.

(10) Patent No.: US 11,456,185 B2
(45) Date of Patent: Sep. 27, 2022

(54) PLANARIZATION OF SEMICONDUCTOR DEVICES

(71) Applicant: Tokyo Electron Limited, Tokyo (JP)

(72) Inventors: Ryan Burns, Austin, TX (US); Mark Somervell, Austin, TX (US); Corey Lemley, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 21 days.

(21) Appl. No.: 16/896,655

(22) Filed: Jun. 9, 2020

(65) Prior Publication Data
US 2020/0395224 A1    Dec. 17, 2020

Related U.S. Application Data

(60) Provisional application No. 62/860,359, filed on Jun. 12, 2019.

(51) Int. Cl.
*H01L 21/321*    (2006.01)
*H01L 21/467*    (2006.01)
*H01L 21/02*    (2006.01)

(52) U.S. Cl.
CPC .. *H01L 21/32115* (2013.01); *H01L 21/02282* (2013.01); *H01L 21/467* (2013.01)

(58) Field of Classification Search
None
See application file for complete search history.

(56) References Cited

U.S. PATENT DOCUMENTS

| 4,576,834 A | * | 3/1986 | Sobczak | H01L 21/316 438/431 |
| 8,415,252 B2 | | 4/2013 | Cheng et al. | |
| 2004/0183220 A1 | * | 9/2004 | Dalmia | B82Y 30/00 264/2.5 |
| 2006/0115983 A1 | * | 6/2006 | Fujii | H01L 21/76879 438/640 |
| 2010/0002329 A1 | | 1/2010 | Hsia et al. | |

(Continued)

FOREIGN PATENT DOCUMENTS

KR    1020160073410 A    6/2016
WO    WO-2018182637 A1 * 10/2018    ....... H01L 21/76826

OTHER PUBLICATIONS

Korean Intellectual Property Office, The International Search Report and the Written Opinion for International application No. PCT/US2020/036778, dated Sep. 24, 2020, 9 pg.

*Primary Examiner* — Erik Kielin
(74) *Attorney, Agent, or Firm* — Slater Matsil, LLP

(57) ABSTRACT

In certain embodiments, a method for processing a substrate includes applying a surface treatment to selected surfaces of the substrate. The substrate has a non-planar topography including structures defining recesses. The method further includes depositing a fill material on the substrate by spin-on deposition. The surface treatment directs the fill material to the recesses and away from the selected surfaces to fill the recesses with the fill material without adhering to the selected surfaces. The method further includes removing the surface treatment from the selected surfaces of the substrate and depositing a planarizing film on the substrate by spin-on deposition. The planarizing film is deposited on the selected surfaces and top surfaces of the fill material.

21 Claims, 8 Drawing Sheets

(56) References Cited

U.S. PATENT DOCUMENTS

| | | | |
|---|---|---|---|
| 2012/0223418 A1* | 9/2012 | Stowers | C23C 18/1216 |
| | | | 257/632 |
| 2018/0047584 A1* | 2/2018 | Pereira | H01L 21/3212 |
| 2018/0212147 A1 | 7/2018 | Ruiz et al. | |
| 2019/0019720 A1* | 1/2019 | Sandhu | H01L 21/288 |
| 2019/0157149 A1 | 5/2019 | Tapily | |

* cited by examiner

PLANARIZATION OF SEMICONDUCTOR DEVICES

CROSS REFERENCE TO RELATED APPLICATIONS

This application claims the benefit of U.S. Provisional Application No. 62/860,359, filed on Jun. 12, 2019, which application is incorporated by reference.

BACKGROUND OF THE INVENTION

This disclosure relates generally to microfabrication, and, in certain embodiments, to planarization of semiconductor devices.

Microfabrication includes various steps of depositing, patterning, modifying, and removing materials from a wafer. Processing to build integrated circuits involves multiple film coatings deposited on patterned topography but with a goal of providing a planar top surface. Depositing a film on a surface with patterned topography benefits subsequent processes. For example, exposing a photolithographic pattern in a layer of photoresist is more successful when exposing on a planar layer of photoresist, or a planar underlayer such as an anti-reflective coating (ARC).

SUMMARY

In certain embodiments, a method for processing a substrate includes receiving a substrate having a non-planar topography including structures defining recesses. The method further includes depositing a self-assembled monolayer (SAM) on top surfaces of the structures of the substrate, without depositing the SAM on surfaces located below the top surfaces of the structures of the substrate. The SAM provides a dewetting surface condition for a particular fill material. The method further includes depositing the particular fill material on the substrate by spin-on deposition such that the particular fill material fills the recesses without adhering to the SAM. The method further includes removing the SAM and depositing a planarizing film on the substrate by spin-on deposition. The planarizing film is deposited on the top surfaces of the structures and on top surfaces of the particular fill material that fills the recesses.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

Figure 1A:
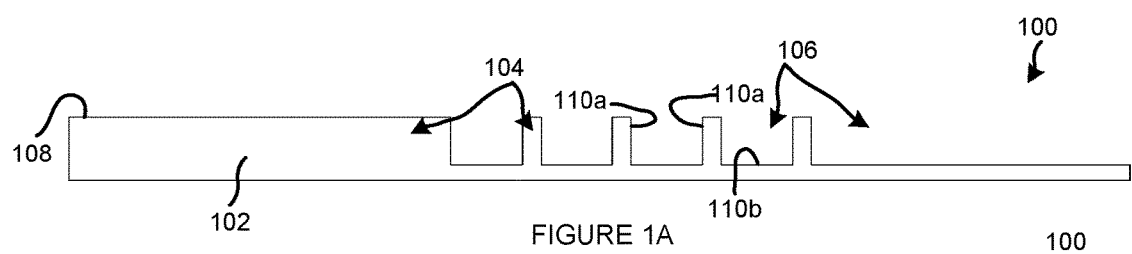
FIGS. 1A-1B illustrate a cross-sectional view of an example process of depositing a planarizing film on a semiconductor device in which incomplete planarization occurs.

Non-planar surfaces may cause yield issues for subsequent steps in a semiconductor fabrication process. As just one example, lithographic imaging is generally used as part of a process to pattern surfaces of a semiconductor device during fabrication. Lithography is used to create desired patterns in an underlying layer, and can include photolithography, electron beam lithography, extreme ultraviolet lithography, and other types of lithography. However, when a resist image lies on top of a non-planar layer (e.g., potentially non-planar due to varied topography of a layer that underlies the non-planar layer), the pattern may be distorted after development due to variations in thickness of the resist image because of the undulations in the surface on which the resist was deposited. These distortions may impact critical dimension and other aspects of fabrication.

Achieving a planarized film when the film is deposited over surfaces having varied topography, leading to a film having a varied topography itself, is difficult. As semiconductor devices have shrunk, planarization has become even more difficult due, at least in part, to attendant increased variations in topography within a smaller area of a wafer undergoing fabrication. For example, decreasing technology nodes down to 5 nm node and beyond continue to exacerbate planarization problems. Furthermore, long-range planarization (e.g., planarization over an area greater than 5 μm) of spin-on-carbons, spin-on-dielectrics, metal oxides, bottom anti-reflective coatings frequently experience incomplete planarization over varied topography, with the resulting film thickness bias exceeding acceptable levels.

One conventional technique to planarize topography is using chemical-mechanical polishing (CMP). While CMP may be useful for some stages of microfabrication, at other stages CMP may present certain problems due to its harsh nature or relatively high cost.

Planarizing by spin-on deposition, also known as spin-on coating, may be desired at some stages of microfabrication. Planarizing by spin-on coating, however, can be very challenging, particularly in certain applications. Deviations in film thicknesses for spin-on films deposited over topography often drive downstream processing beyond appropriate specifications necessitating actions to control the planarization of films.

Unit operations having errors introduced due to deviations in film thickness height include, for example, lithographic critical dimension changes due to reflectivity, lithographic focus control, etch depth, and subsequent deposition processes. Additionally, novel three-dimensional applications and processes such as pattern reversals and exhuming materials post spacer processes may call for stringent levels of film thickness control over topography.

Thus, where appropriate, semiconductor fabrication processes often include steps designed to planarize one or more surfaces of a semiconductor, at one or more stages of the semiconductor fabrication process, to a desired extent or as much as possible.

Embodiments of this disclosure provide improved techniques for planarizing a film deposited over a substrate having a varied topography. Embodiments of this disclosure include applying a surface treatment (e.g., a self-assembled monolayer) to selected surfaces of a substrate that has a varied topography (including structures that define recesses). For example, the surface treatment may be applied to top surfaces of the substrate and not to surfaces of the substrate in the recesses. The surface treatment creates a surface condition in which the particular fill material is less likely to (or does not) form on the selected surfaces of the substrate that include the surface treatment (e.g., the top surfaces of the substrate) and is directed to and deposited on other surfaces of the substrate to which the surface treatment has not been applied (e.g., surfaces in the recesses). As an example, the surface treatment may be described as creating a dewetting surface condition on the top surfaces of the substrate to direct the particular fill material to the recesses, which are "wettable" relative to the particular fill material.

The particular fill material is then deposited and fills the recesses in the substrate, "pre-filling" the recesses prior to a subsequent deposition of a planarizing film. The particular fill material may be deposited such that the top surfaces of the substrate and the deposited particular fill material in the recesses provides an effectively planar surface. In certain embodiments, after removing the surface treatment and any other suitable layers (e.g., a hardmask), a planarizing film is deposited (e.g., an organic film deposited using a spin-on deposition process) on the effectively planar surface of the substrate resulting from depositing the particular fill material in the recesses, which has improved planarization relative to films deposited using conventional techniques.

Embodiments of this disclosure include spin-on planarization methods incorporating use of surface selective monolayers. Spin-on surface selective monolayers may have reasonable processing times and an ability to control film dewetting relative to a surface to which the surface selective monolayer has not been applied. Embodiments of this disclosure include adhering surface selective monolayer(s) to a hardmask surface to guide a spin-on film into recesses of a given substrate topography, such as trench areas. This initial spin-on film can fill in topography up to a top surface of the substrate. Then a second spin-on film is deposited to finish planarizing the substrate. Multiple different materials can be used in embodiments of this disclosure. Such techniques can improve planarization by spin-on deposition and can reduce processing cost and increase yield.

Figure 1B:
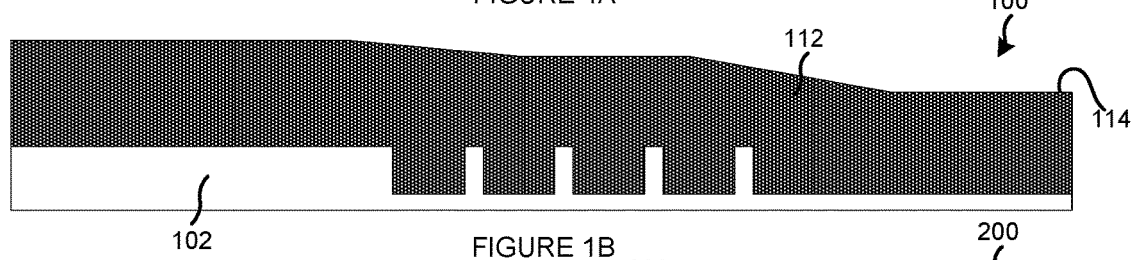

FIGS. 1A-1B illustrate a cross-sectional view of an example process of depositing a planarizing film on a semiconductor device 100 in which incomplete planarization occurs. As shown in FIG. 1A, semiconductor device 100 includes a substrate 102, which may be a portion of a substrate of a larger device (e.g., wafer or semiconductor wafer) undergoing microfabrication.

Substrate 102 has a non-planar topography that includes structures 104 defining recesses 106. Although a particular number of structures 104 and recesses 106 are illustrated, this disclosure contemplates substrates like substrate 102 including any suitable number of structures 104 and recesses 106. Throughout this disclosure, structures of substrates (e.g., structures 104 and structures described below with reference to other figures) also may be referred to as raised regions. Although this disclosure primarily describes "recesses," it will be appreciated that other suitable features might be formed in a semiconductor layer, including (whether or not considered "recesses") lines, holes, open areas, trenches, vias, and/or other suitable structures, using embodiments of this disclosure. Recesses (e.g, recesses 106 or other recess of this disclosure) may be formed, for example, by building up structures (e.g., structures 104 or other structures of this disclosure) on underlying layers and/or by etching material from one or more layers.

Substrate 102 may include top surfaces 108, which also may be referred to as top surfaces 108 of structures 104 of substrate 102. Recesses 106 may include surfaces 110, such as sidewall surfaces 110a and bottom surfaces 110b. Surfaces 110 of recesses 106 may be considered to be located below top surfaces 108 of structures 104 of substrate 102.

Substrate 102, including structures 104 of substrate 102, can be of any suitable material, such as organic hardmasks, oxides, nitrides, dielectrics, barrier materials, or conducting materials. In a particular example, substrate 102 includes silicon dioxide.

FIG. 1B illustrates a cross-sectional view of semiconductor device 100 after a planarizing film 112 has been deposited on substrate 102. In one example, planarizing film 112 is deposited using a spin-on deposition process; however, this disclosure contemplates planarizing film 112 being deposited in any suitable manner. In certain embodiments, planarizing film 112 includes an organic material, such as a spin-on carbon; however, this disclosure contemplates planarizing film 112 including any suitable material.

With spin-on planarization, a particular material (e.g., the material of planarizing film 112) is deposited on a substrate (e.g., substrate 102). The substrate is then rotated (if not already rotating, possibly at a relatively low velocity) at a relatively high velocity so that centrifugal force causes deposited material to move toward edges of the substrate, thereby coating the substrate. Excess material is typically spun off the substrate.

When a given topology or relief pattern has regions of densely arranged structures (e.g., from the left of FIGS. 1A and 1B, the first four recesses 106) this density can push deposition material upward and manipulate a mass fraction of how much material can go into recesses. In regions of sparsely arranged or populated features (for example, where there is an isolated line without other features nearby) (e.g., the right-most recess 106 in FIGS. 1A and 1B), the deposited material can settle down into these larger pockets such that a final deposited z-height will track with the percent open regions. While these problems can exist at technology nodes of various sizes, these problems can be exacerbated as technology nodes continue to shrink, where the width of recesses 106 become even smaller and the features more densely packed, creating increased topography variations in an even tighter space.

FIG. 1B illustrates an example result of a spin-on deposition of planarizing film 112, with film z-height variations over areas of the topography of substrate 102. For example, a top surface 114 of planarizing film 112 is non-planar. It should be understood that the changing topography of planarizing film 112 as shown in FIG. 1B is merely an example, and that actual changes in topography may vary from deposition to deposition, even with a substrate having a similar topography to the topography of substrate 102.

Figure 2A:
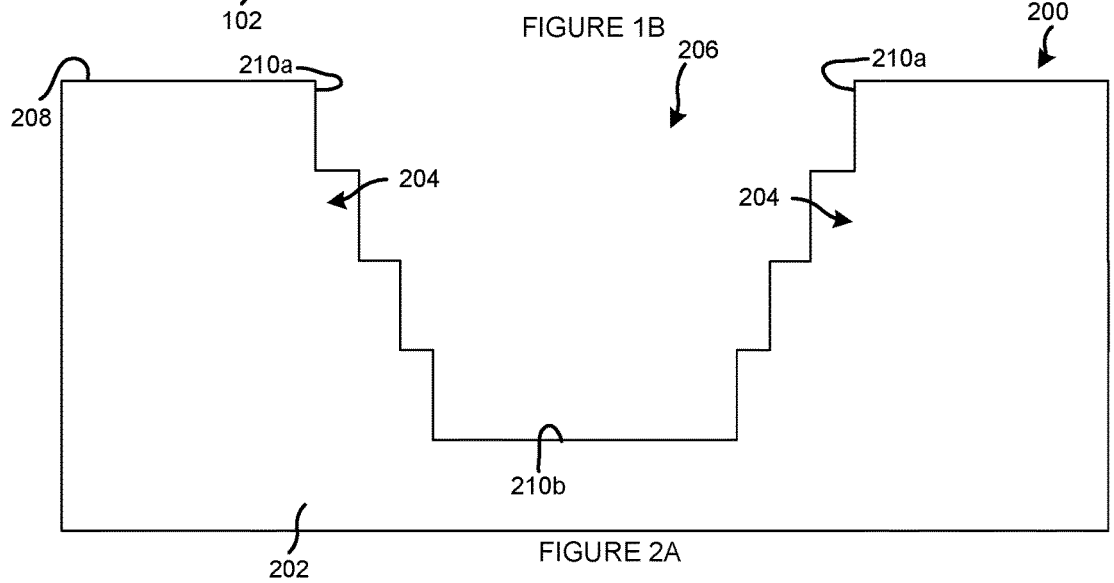
FIGS. 2A-2B illustrate a cross-sectional view of an example process of depositing a planarizing film on a semiconductor device in which incomplete planarization occurs.
Figure 2B:
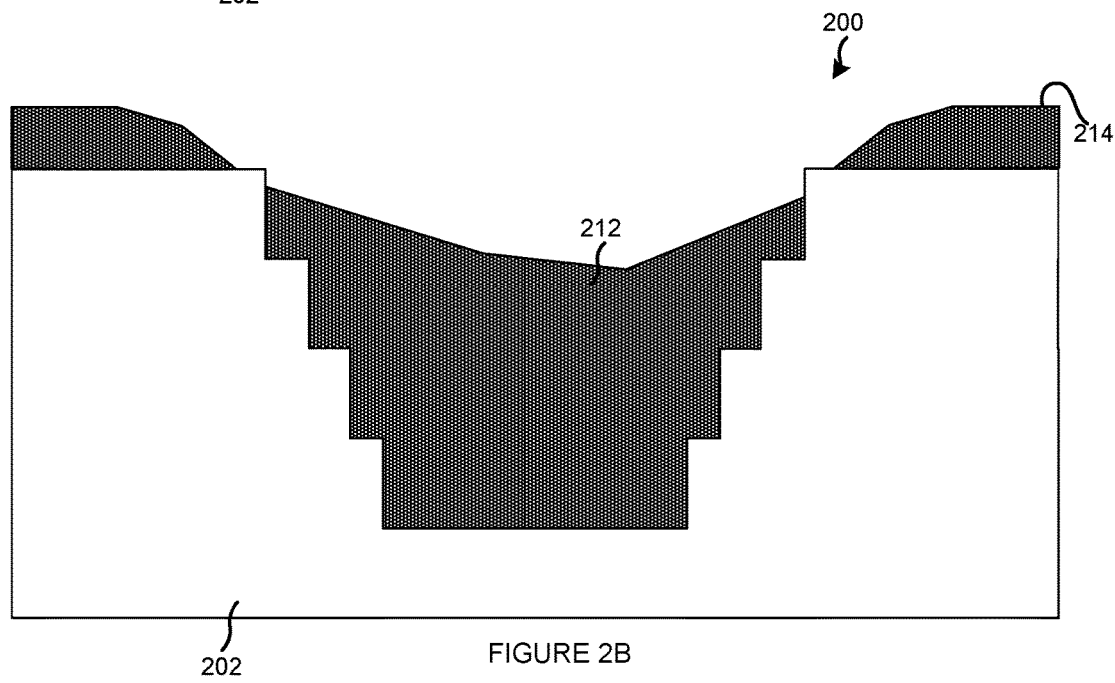

FIGS. 2A-2B illustrate a cross-sectional view of an example process of depositing a planarizing film on a semiconductor device 200 in which incomplete planarization occurs. As shown in FIG. 2A, semiconductor device 200 includes a substrate 202, which may be a portion of a substrate of a larger device (e.g., wafer or semiconductor wafer) undergoing microfabrication.

Substrate 202 has a non-planar topography that includes structures 204 defining recess 206. Although a particular number of structures 204 and recesses 206 are illustrated, this disclosure contemplates substrates like substrate 202 including any suitable number of structures 204 and recesses 206. Throughout this disclosure, structures 204 also may be referred to as raised regions.

Structures 204 and recess 206 of substrate 202 form what may be considered a three-dimensional feature (e.g., a three-dimensional trench). Simultaneously filling and planarizing such structures with minimal processing steps can be difficult. Such structures vary depending on application but can have considerable size variations, possibly on the order of microns wide or deep.

Substrate 202 may include top surfaces 208, which also may be referred to as top surfaces 208 of structures 204 of substrate 202. Recess 206 may include surfaces 210, such as sidewall surfaces 210a and bottom surfaces 210b. In the illustrated example, sidewall surfaces 210a create a stepped sidewall of recess 206, incrementally increasing, moving from the bottom of recess 206 to the top of recess 206, a width of recess 106. Surfaces 210 of recess 206 may be considered to be located below top surfaces 208 of structures 204 of substrate 202.

Substrate 202, including structures 204 of substrate 202, can be of similar materials as substrate 102.

FIG. 2B illustrates a cross-sectional view of semiconductor device 200 after a planarizing film 212 has been deposited on substrate 202. In one example, planarizing film 212 is deposited using a spin-on deposition process similar to the spin-on process described above with reference to FIGS. 1A-1B; however, this disclosure contemplates planarizing film 212 being deposited in any suitable manner. In certain embodiments, planarizing film 212 includes an organic material, such as a spin-on carbon; however, this disclosure contemplates planarizing film 212 including any suitable material.

FIG. 2B illustrates an example result of a spin-on deposition coating with film z-height variations over areas of topography. For example, a top surface 214 of planarizing film 212 is non-planar. It should be understood that the changing topography of planarizing film 212 as shown in FIG. 2B is merely an example, and that actual changes in topography may vary from deposition to deposition, even with a substrate having a similar topography to the topography of substrate 202. While these problems can exist at technology nodes of various sizes, these problems can be exacerbated as nodes continue to shrink below the 10 nm node size (e.g., down to the currently possibly 5 nm node size), where the width of recesses 106 become even smaller and the features more densely packed, creating increased topography variations in an even tighter space.

As can be seen from FIGS. 1A-1B and FIGS. 2A-2B, merely depositing a planarizing film on a substrate that has a varied topography may lead to the film having incomplete planarization, which can negatively affect subsequent steps of the fabrication process.

FIGS. 3A-3E illustrate a cross-sectional view of an example semiconductor device 300 at various stages of a process for depositing a planarizing film, according to certain embodiments of this disclosure. As described in greater detail below, the example process of FIGS. 3A-3E includes applying a surface treatment to selected surfaces of a substrate of semiconductor device 300 and depositing a planarizing film in multiple deposition steps.

Figure 3A:
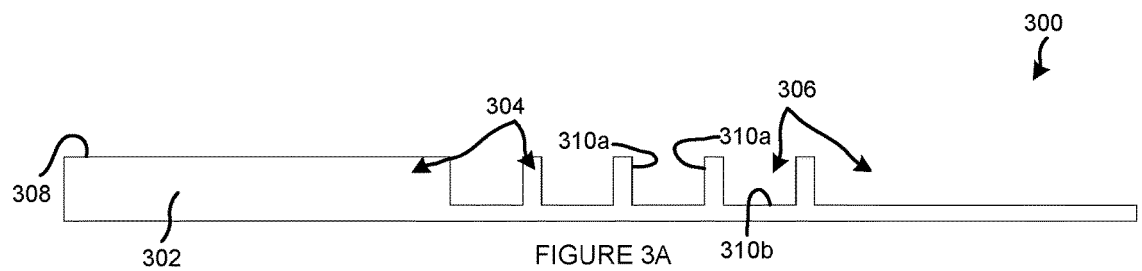
FIGS. 3A-3E illustrate a cross-sectional view of an example semiconductor device at various stages of a process for depositing a planarizing film, according to certain embodiments of this disclosure.

As shown in FIG. 3A, semiconductor device 300 is largely similar to semiconductor device 100 in FIG. 1A and includes a substrate 302, which may be a portion of a substrate of a larger device (e.g., wafer or semiconductor wafer) undergoing microfabrication. Substrate 302, structures 304, recesses 306, top surfaces 308, surfaces 310 are generally analogous to substrate 202, structures 204, recesses 206, top surfaces 208, and surfaces 210, the descriptions of which are incorporated by reference without being repeated.

Figure 3B:
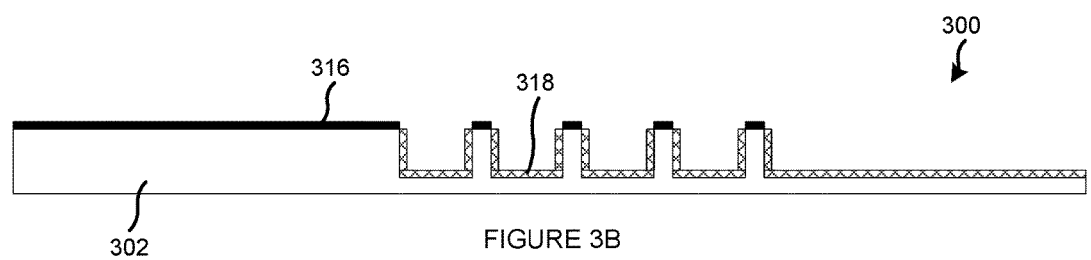
Figure 3C:
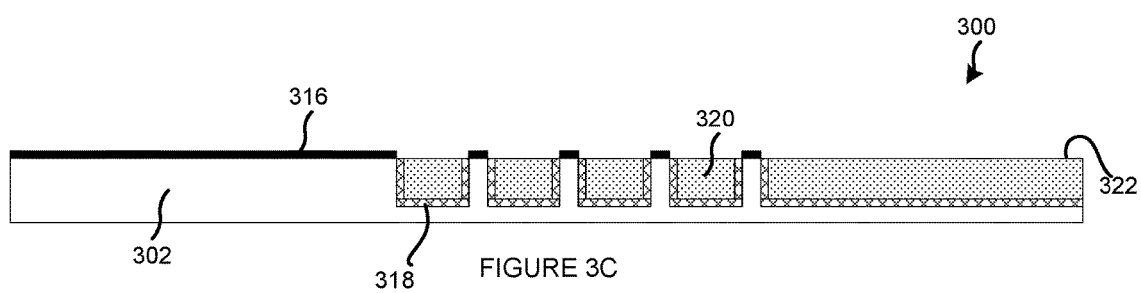

FIGS. 3B-3C illustrate stages of the process for depositing a planarizing film on substrate 302 in which a surface treatment is applied to selected surfaces of substrate 302 and in which recesses 306 of substrate 302 are filled (partially or entirely) with a fill material. That is, rather than proceeding to depositing a planarizing film on substrate 302 (as was the case with substrate 102 in FIGS. 1A-1B), a surface treatment is first applied to selected surfaces of substrate 302, and recesses 306 of substrate 302 are filled (partially or entirely) with a fill material to provide an underlying topography that is more planar than the topography illustrated in FIGS. 3A-3B.

In the illustrated example, as shown in FIG. 3B, a surface condition 316 exists on top surfaces 308 of substrate 302, and a surface condition 318 exists on surfaces 310 of recesses 306.

A surface having surface condition 316 (top surfaces 308 of substrate 302 in the illustrated example) tends to repel or otherwise direct certain fill materials, such as the particular fill material to be deposited in FIG. 3C, away from the surface having surface condition 316. Surface condition 316 also may be referred to as a dewetting state or dewetting surface condition. In certain embodiments, surface condition 316 provides a high hydrophobicity mechanism that directs certain fill materials away from surfaces that have surface condition 316. In a dewetting state, the surface contact angle may be matched for optimum solute/solvent dewetting for a particular fill material, such as the fill material to be deposited in FIG. 3C.

A surface having surface condition 318 (surfaces 310 of recesses 306 in the illustrated example) tends to bond with or even attract certain fill materials, such as the particular fill material to be deposited in FIG. 3C, to the surface having surface condition 318. Surface condition 318 also may be referred to as a wettable state. In a wettable state, the surface contact angle may be matched for optimum solute/solvent wettability for a particular fill material, such as the fill material to be deposited in FIG. 3C.

One or both of surface condition 316 and surface condition 318 may be created by applying a surface treatment to the surface(s) of substrate 302 at which those conditions exist. The surface condition of a surface of substrate 302 also may be referred to as the surface energy of the surface, such that changing the surface condition of a surface changes the surface energy of the surface.

For example, to provide selected surfaces (e.g., top surfaces 308) of substrate 302 with surface condition 316, a surface treatment may be applied to surfaces of substrate 302 targeted to have surface condition 316. The surface treatment creates a dewetting surface condition relative to a particular fill material (the fill material to be deposited in FIG. 3C) and may be deposited on top surfaces 308 of substrate 302 to direct the fill material away from the surfaces to which the surface treatment has been applied (top surfaces 308 of substrate 302). In certain embodiments, applying the surface treatment to top surfaces 308 of substrate 302 includes depositing a self-assembled monolayer (SAM) on top surfaces 308 of substrate 302. SAMs are described in greater detail below.

As another example, to provide selected surfaces (e.g., surfaces 310) of substrate 302 with surface condition 318, a change to a surface condition of the selected surfaces might or might not be appropriate. In certain embodiments, the material at the selected surfaces (e.g., surfaces 310 of recesses 306) may have been selected to be wettable relative to a particular fill material (the fill material to be deposited in FIG. 3C), or the particular fill material (the fill material to be deposited in FIG. 3C) may have been selected because the material at the selected surfaces (e.g., surfaces 310 of recesses 306) is wettable relative to that particular fill material without additional processing of the surface of substrate 302. In certain embodiments, surfaces of substrate 302 at which deposition of the fill material is desired, however, may be treated to facilitate deposition of the fill material at those surfaces.

As shown in FIG. 3C, fill material 320 is deposited in recesses 306 over surfaces 310 of recesses 306, surfaces which have surface condition 318. As fill material 320 is deposited, surface condition 316 of top surfaces 308 of substrate 302 directs fill material 320 to recesses 306 and away from top surfaces 308 to fill recesses 306 with fill material 320 without adhering to surfaces that have surface condition 316 (top surfaces 308). In certain embodiments, the combination of surface condition 316 on selected surfaces of substrate 302 (e.g., top surfaces 308 of substrate 302) and surface condition 318 on other surfaces of substrate 302 (e.g., surfaces 310 in recesses 306 of substrate 302) promotes deposition of fill material 320 in recesses 306, without depositing fill material 320 on the selected surfaces (e.g., top surfaces 308) of substrate 302.

Throughout this disclosure, reference is made to a fill material (e.g., fill material 320 and other fill materials described with reference to other figures below) filling a recess or recesses (e.g., recesses 306 or other recesses described with reference to other figures below). This disclosure contemplates the fill material partially filling recesses, exactly filling recesses with no overflow or underflow, or overfilling recesses.

Fill material 320 may include any suitable material and may be deposited using a particular solute/solvent combination. As just a few examples, fill material 320 may be a photo resist, a silicon-containing anti-reflective coating, a spin-on organic carbon, or a spin-on dielectric. In the case of a photoresist, a photoresist may include several components, including but not limited to a polymer backbone, solvent, photo acid generator (PAG), and base quencher. Example base polymers may include Novolac Resin, Poly methyl methacrylate, and Poly(Styrene)-B-Poly(4-Hydroxystyrene).

Spin-on carbon or organic materials may be used in a patterning process to optimize optical reflection, planarization, and/or etch resistance. Typical formulas are often highly aromatic (AR) and contain crosslinking components. Polystyrene is an example of an aromatic, high carbon content spin-on polymer. In an example of spin-on dielectric, a spin-on dielectric may be a functional, silicon-containing, inorganic polymer material. A particular example spin-on dielectric is Polysilazane. In certain embodiments, fill material 320 is deposited using a spin-on deposition process. As just one example, fill material 320 may be an organic material deposited using a spin-on deposition process, such as a spin-on carbon.

As shown in FIG. 3C, after deposition of fill material 320, fill material 320 may substantially fill recesses 306 such that top surfaces 308 of substrate 302 and top surfaces 322 of fill material 320 collectively provide a substantially planar surface for subsequent deposition of a planarizing film. The surface treatment (e.g., a deposited SAM) that creates surface condition 316 (e.g., a dewetting surface condition) for top surfaces 308 of substrate 302 directs fill material 320 to recesses 306 without depositing fill material 320 on top surfaces 308 of substrate 302. Directing fill material 320 to recesses 306 allows fill material 320 to reduce and potentially eliminate at least a portion of the variation in topography present in substrate 302 (e.g., the variation in topography shown in FIGS. 3A-3B). Deposited fill material 320 in recesses 306 provides an improved (and potentially generally flat) surface for depositing a planarizing film in a subsequent deposition step rather than depositing the planarizing film on the varied topography of substrate 302 shown in FIGS. 3A-3B.

Figure 3D:
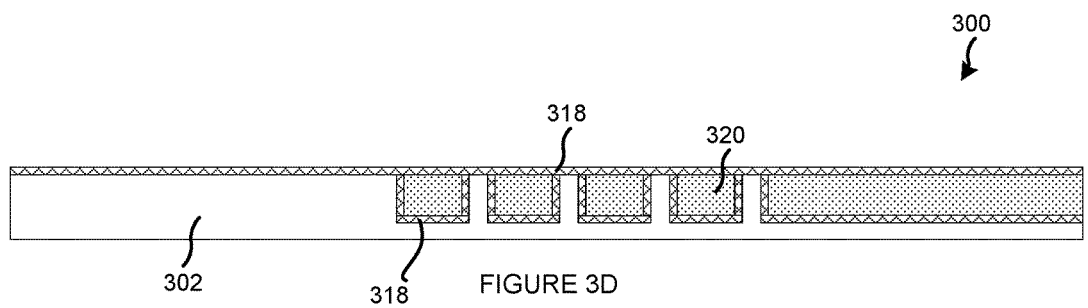

As shown in FIG. 3D, top surfaces 308 of substrate 302 and top surfaces 322 of fill material 320 both have surface condition 318. In certain embodiments, to accomplish both top surfaces 308 and top surfaces 322 having surface condition 318 (e.g., a wettable condition relative to a planarizing film to be deposited), the surface treatment applied to the selected surfaces of substrate 302 (top surfaces 308 of substrate 302) in FIG. 3B is removed. Any suitable process may be used to remove the surface treatment from the selected surfaces of substrate 302.

Figure 3E:
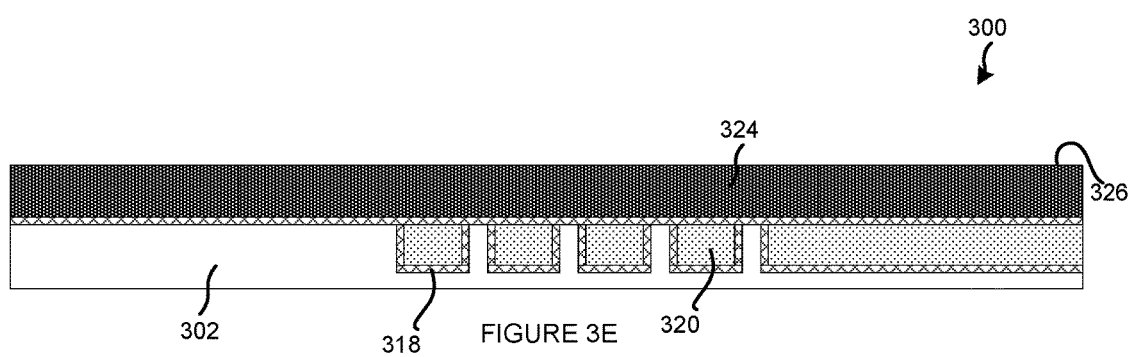

As shown in FIG. 3E, a planarizing film 324 is deposited on substrate 302. Planarizing film 324 may include any suitable material. In certain embodiments, the material of planarizing film 324 is the same material as the material of fill material 320; however, this disclosure contemplates fill material 320 and planarizing film 324 including different materials. Due at least in part to the improved planarity of substrate 302 after fill material 320 has been deposited (e.g., as shown in FIG. 3C) relative to the varied topography of substrate 302 shown in FIG. 3A, a top surface 326 of planarizing film 324 has an improved planarity. For example, top surface 326 of planarizing film 324 has an improved planarity relative to top surface 114 of planarizing film 112 in FIG. 1B.

Planarizing film 324 may be deposited in any suitable manner. In certain embodiments, planarizing film 324 is deposited using a spin-on deposition process. For example, planarizing film 324 may include an organic material. As a particular example, planarizing film 324 may be a spin-on carbon. Planarizing film 324 may be deposited to a desired thickness that is appropriate for a particular implementation.

Following the deposition of planarizing film 324, which has improved planar characteristics, additional features of semiconductor device 300 may be formed in layers above or below planarizing film 324. As just a few examples, these features may include metal lines, vias, or other suitable features. Due to the improved planar characteristics of planarizing film 324, subsequently patterned features showed improved dimensional control and ultimately improved downstream yield.

FIGS. 4A-4E illustrate a cross-sectional view of an example semiconductor device 400 at various stages of a process for depositing a planarizing film, according to certain embodiments of this disclosure. As described in greater detail below, the example process of FIGS. 4A-4E includes applying a surface treatment to selected surfaces of a substrate of semiconductor device 400 and depositing a planarizing film in multiple deposition steps.

Figure 4A:
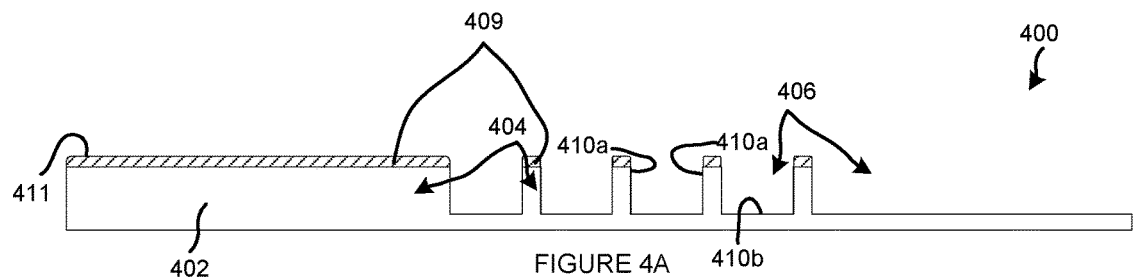
FIGS. 4A-4E illustrate a cross-sectional view of an example semiconductor device at various stages of a process for depositing a planarizing film, according to certain embodiments of this disclosure.

Semiconductor device 400, as illustrated in FIG. 4A, is analogous and largely similar to semiconductor device 300, as illustrated in FIG. 3A; however, semiconductor device 400 includes a hardmask 409. Semiconductor device 400 includes a substrate 402, which is analogous to substrate 302 and may include similar structures and materials, descriptions of which are not repeated. Substrate 402, structures 404, recesses 406, top surfaces 408, surfaces 410 are generally analogous to substrate 302, structures 304, recesses 306, top surfaces 308, and surfaces 310, the descriptions of which are incorporated by reference without being repeated.

Semiconductor device 400 includes hardmask 409, which may include any suitable material, and may have been used to form recesses 406. As examples, hardmask 409 may include a resist layer, a spin-on carbon layer, an amorphous carbon layer (whether or not deposited using a spin-on deposition process), a silicon nitride layer, a silicon dioxide layer, a metal-containing layer, or any other suitable type of hardmask. Although described as a hardmask, hardmask 409 could be any suitable type of deposited film, such as a resist layer.

In certain embodiments, hardmask 409 is relatively thin, such as, for example, 2 nm to 20 nm, relative to an underlying layer (e.g., underlying portions of substrate 402). Hardmask 409 has a top surface 411. Subsequent to formation of recesses 406, and as shown in FIG. 4A, hardmask 409 may be located at top surfaces 408 of structures 404 of substrate 402, which also may be referred to as top surfaces 408 of substrate 402. Although shown as a separate layer in FIG. 4, hardmask 409 may be a separate layer formed on top surfaces 408 of substrate 402 or could be included in substrate 402, such that substrate 302 in FIGS. 3A-3E could include hardmask as a top layer. Thus, for purposes of this disclosure, top surface 411 of hardmask 409 could also be considered a top surface of substrate 402.

Figure 4B:
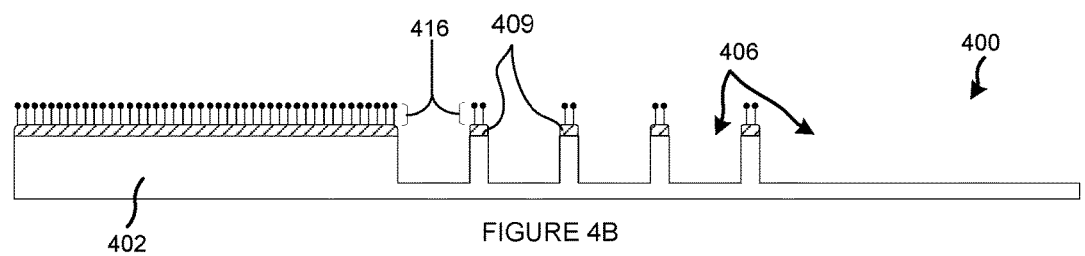
Figure 4C:
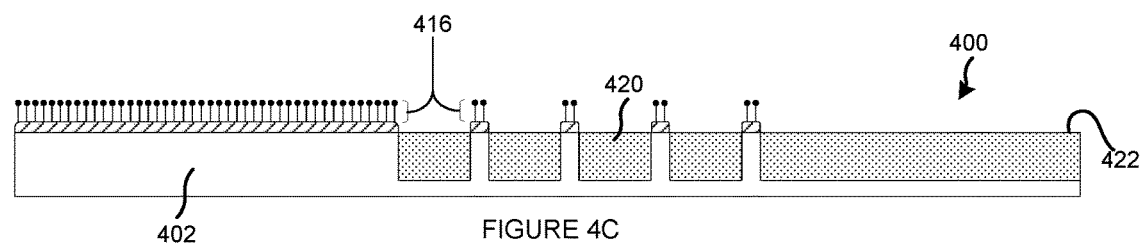

FIGS. 4B-4C illustrate stages of the process for depositing a planarizing film on substrate 402 in which a surface treatment is applied to selected surfaces of substrate 402 and in which recesses 406 of substrate 402 are filled (partially or entirely) with a fill material. That is, rather than proceeding to depositing a planarizing film on substrate 402 (as was the case with substrate 102 in FIGS. 1A-1B), a surface treatment is first applied to selected surfaces of substrate 402, and recesses 406 of substrate 402 are filled (partially or entirely) with a fill material to provide an underlying topography that is more planar than the topography illustrated in FIGS. 4A-4B.

In the illustrated example of FIG. 4B, a surface treatment 416 is applied to top surfaces 411 of hardmask 409 (which also may be considered top surfaces of substrate 402), and surface treatment 416 is not applied to surfaces 410 of recesses 406 of substrate 402. Surface treatment 416 creates surface condition 316 in which a surface having surface condition 316 (e.g., top surfaces 411 of hardmask 409 in the illustrated example) tends to repel or otherwise direct certain fill materials, such as the particular fill material to be deposited in FIG. 4C, away from the surface having surface condition 316.

Surfaces 410 in recesses 406 of substrate 402 may have a surface condition analogous to surface condition 318 a surface having surface condition 318 tends to bond with or even attract certain fill materials, such as the particular fill material to be deposited in FIG. 4C, to the surface having surface condition 318.

In certain embodiments, surface treatment 416 is a SAM deposited to create surface condition 316 for surfaces on which the SAM is deposited. For example, to provide selected surfaces of substrate 402 (e.g., top surfaces 411 of hardmask 409) with surface condition 316 (a dewetting state for the fill material to be deposited in FIG. 4C), surface treatment 416 may be applied to surfaces of substrate 402 targeted to have surface condition 316 to direct the fill material away from the surfaces to which surface treatment 416 has been applied.

In certain embodiments, applying surface treatment 416 to top surfaces 411 of hardmask 409 includes depositing a SAM on top surfaces 411 of hardmask 409. As a particular example, the SAM may be a liquid phase self-assembled monolayer. Although described as a monolayer, one of skill in the art will appreciate that complete coverage of surface treatment 416 might or might not be achieved and that aspects of this disclosure can still be accomplished. In other words, perfect alignment of the SAM (or other suitable surface treatment) is not required, as solute/solvent dewetting can occur without complete monolayer alignment. A given surface-selective monolayer has a terminal molecular group designed to cause dewetting of the spun on material.

Surface treatment 416 may be applied in any suitable manner. In certain embodiments, surface treatment 416 (e.g., SAM) is deposited through spin-on techniques or a low temperature chemical vapor deposition (CVD) process. For example, a particular surface treatment 416 (e.g., SAM) may be deposited on selected surfaces of substrate 402 (e.g., top surfaces 411 of hardmask 409). The applied surface treatment 416 may be selective to a particular underlying material, so that the surface treatment 416 is applied to particular surfaces and not others. For example, surface treatment 416 may be selective to the material of hardmask 409, so that surface treatment 416 is deposited on top surface 411 of hardmask 409 and not on surfaces 410 of recesses 406. The particular process steps and chemistry for depositing surface treatment may vary depending on the surface treatment, surface to which the surface treatment is being applied, and the deposition technique.

Surface treatments, including self-assembled monolayers (SAMs), may be applied to purely polycrystalline surfaces and to other types of organic materials or liquids. Surface treatment 416 may be tuned for adherence to particular substrates and to provide particular functionality (e.g, liquid dewetting) for various applications. Liquid phase SAMs may be able to selectively and significantly change wetting properties of surfaces such as metals (e.g. copper), hardmasks, oxides, organic surfaces, and other dielectrics, to name just a few examples.

As shown in FIG. 4C, fill material 420 is deposited in recesses 406 over surfaces 410 of recesses 406, surfaces to which surface treatment 416 has not been applied and which generally have a surface condition analogous to surface condition 318. As fill material 420 is deposited, surface treatment 416 of top surfaces 411 of hardmask 409 directs fill material 420 to recesses 406 and away from top surfaces 411 to fill recesses 406 with fill material 420 without adhering to surfaces to which surface treatment 416 has been applied (e.g., top surfaces 411 of hardmask 409). In certain embodiments, the combination of surface treatment 416 on selected surfaces of substrate 402 (e.g., top surfaces 411) and a lack of surface treatment 416 on other surfaces (e.g., surfaces 410 in recesses 406) promotes deposition of fill material 420 in recesses 406, without depositing fill material 420 on the selected surfaces of substrate 402.

Fill material 420 is generally analogous to fill material 320, the details of which are incorporated by reference.

Furthermore, in certain embodiments, depending for example, on the topography of substrate 402, including the depth of recesses 406 and the selected fill material 420 and associated deposition technique, one or multiple deposition steps may be executed until reaching a desired fill level. In certain embodiments, fill material 420 is deposited using a spin-on deposition process. As just one example, fill material 420 may be an organic material deposited using a spin-on deposition process, such as a spin-on carbon.

As shown in FIG. 4C, after deposition of fill material 420, fill material 420 may substantially fill recesses 406 such that top surfaces 408 of substrate 402 and top surfaces 422 of fill material 420 collectively provide a substantially planar surface for subsequent deposition of a planarizing film. As described above, surface treatment 416 (e.g., a deposited SAM) creates surface condition 316 for top surfaces 411 of hardmask 409, directing fill material 420 to recesses 406 without depositing fill material 420 on top surfaces 411 of hardmask 409. Directing fill material 420 to recesses 406 allows fill material 420 to reduce and potentially eliminate at least a portion of the variation in topography present in substrate 402 (e.g., the variation in topography shown in FIGS. 4A-4B). Deposited fill material 420 in recesses 406 provides an improved (and potentially generally flat) surface for depositing a planarizing film in a subsequent deposition step rather than depositing the planarizing film on the varied topography of substrate 402 shown in FIGS. 4A-4B.

In a particular example, with a SAM bonded to a surface of substrate 402 (e.g., a top surface 411 of hardmask 409), a particular fill material 420 solute/solvent can be used for spin-on deposition. For spin-on deposition, the particular fill material 420 may be deposited on substrate 402, and substrate 402 may then be rotated to spread the particular fill material 420 across the surface of substrate 402, potentially evenly. With the SAM adhered to top surfaces 411 of hardmask 409, top surfaces 411 of hardmask 409 have a surface energy that essentially repels the particular fill material 420. After spin-coating the particular fill material 420, the particular fill material 420 fills recesses 406, creating an approximately planar surface, without being deposited on top surfaces 411 of hardmask 409. The particular fill material 420 (e.g., a particular polymer) can be selected based on dewetting properties of a selected surface treatment 416 (e.g., SAM), or a particular surface treatment 416 (e.g., a particular SAM) can be selected based on a desired fill material 420 (e.g., a particular polymer).

Figure 4D:
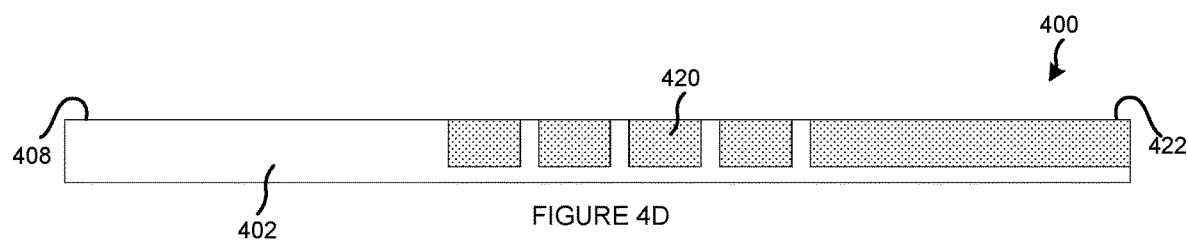

As shown in FIG. 4D, surface treatment 416 and hardmask 409 have been removed from semiconductor device 400. In certain embodiments, in one or more etch stops, surface treatment 416 and hardmask 409 are removed by any suitable combination of a wet solvent strip, a wet etch, a plasma etch, or a UV/O$_2$ treatment. This disclosure contemplates any suitable type of removal process for removing surface treatment 416 and hardmask 409.

FIG. 4D shows semiconductor device 400 after deposition of fill material 420 and removal of surface treatment 416 and hardmask 409. The removal process used to remove surface treatment 416 and hardmask 409 leaves fill material 420 in recesses 406 of substrate 402. In certain embodiments, an etchant used in one or more etch steps to remove surface treatment 416 and hardmask 409 is selective to surface treatment 416 and/or hardmask 409, and does not etch (or etches only a minimal amount of) fill material 420. As a result, recesses 406 are filled with fill material 420, such that top surfaces 408 of substrate 402 and top surfaces 422 of fill material 420 together form an essentially planar surface.

In certain embodiments, recesses 406 become somewhat over filled, as a result of the deposition process used to deposit fill material 420 in FIG. 4C. This over filled condition may appear as an elevation over recesses 406 as the fill material 420 fills, but dewets from surfaces that have surface treatment 416 (e.g., top surfaces 411 of hardmask 409). This small overfilled region may be absorbed in subsequent depositions (e.g., during deposition of a planarizing film, as described below with reference to FIG. 4E), or could be removed by an etch step or CMP, if desired. This overburden deposition and removal process can be used to reduce or eliminate instances in which fill material 420 does not completely fill recesses 406.

In FIG. 4D, both top surfaces 408 of substrate 402 and top surfaces 422 of fill material 420 have a surface condition analogous to surface condition 318 (e.g., wettable with respect to planarizing film to be deposited in a subsequent step).

Figure 4E:
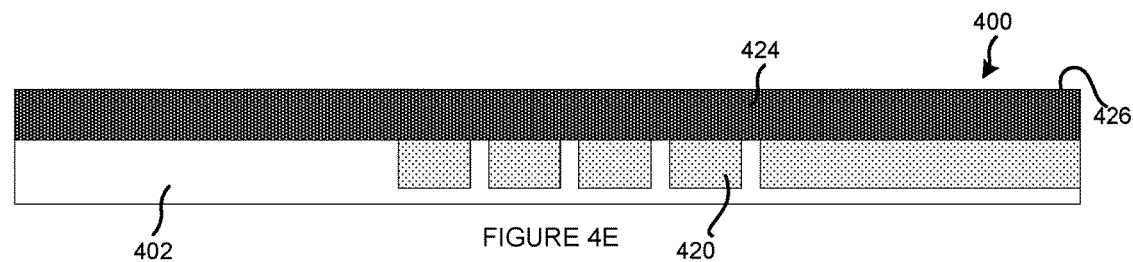

As shown in FIG. 4E, a planarizing film 424 is deposited on substrate 402. FIG. 4E is generally similar to FIG. 3E, with references to fill material 320, planarizing film 324, top surface 326 being replaced by references to fill material 420, planarizing film 424, top surface 426, respectively, along with other suitable analogous substitutions of analogous elements. Thus, the above description of FIG. 3E and its associated advantages is incorporated by reference with being repeated.

With recesses 406 of substrate 402 already filled (or mostly filled or slightly overfilled) with fill material 420, the varied topography of substrate 402 that was present in FIGS. 4A and 4B has been reduced or eliminated, and a second spin-on deposition step for depositing planarizing film 424 can more effectively planarize above substrate 402 to a desired thickness level now that there is minimal z-height deviation.

With substrate 402 planarized, additional microfabrication steps can be executed. For example, following the deposition of planarizing film 424, which has improved planar characteristics, additional features of semiconductor device 400 may be formed in layers above or below planarizing film 424. As just a few examples, these features may include metal lines, vias, or other suitable features. Due to the improved planar characteristics of planarizing film 424, subsequently patterned features tend to have improved dimensional control and ultimately improved downstream yield.

FIGS. 5A-5E illustrate cross-sectional views of an example semiconductor device 500 at various stages for depositing a planarizing film, according to certain embodiments of this disclosure. As described in greater detail below, the example process of FIGS. 5A-5E includes applying a surface treatment to selected surfaces of a substrate of semiconductor device 500 and depositing a planarizing film in multiple deposition steps. The example process of FIGS. 5A-5E, which incorporates the use of a surface treatment to modify a surface condition of one or more portions of a substrate, can provide an improved ability to planarize a film (e.g., a spin-on carbon) deposited over an extended recessed region as part of an etchback process.

Figure 5A:
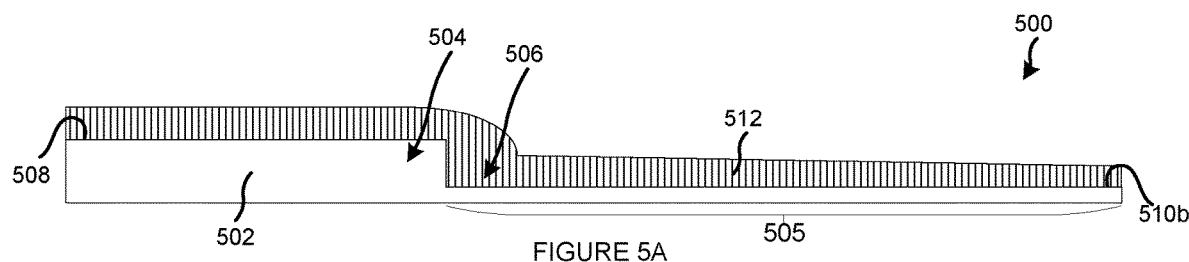
FIGS. 5A-5E illustrate cross-sectional views of an example semiconductor device at various stages for depositing a planarizing film, according to certain embodiments of this disclosure.

As shown in FIG. 5A, in the illustrated example, semiconductor device 500 includes a substrate 502, which may be a portion of a substrate of a larger device (e.g., wafer or semiconductor wafer) undergoing microfabrication. Substrate 502 has a non-planar topography that includes a raised region 504 and a recessed region 505 having a recess 506.

Although a particular number of raised regions 504 and recessed regions 505/recesses 506 are illustrated, this disclosure contemplates substrates like substrate 502 including any suitable number of raised regions 504 and recessed regions 505/recesses 506. Raised region 504 also may be referred to as a structure.

Figure 5B:
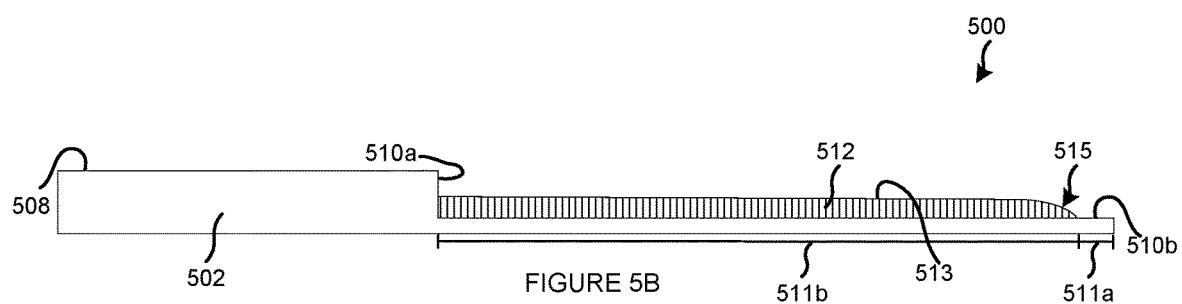

Substrate 502 may include top surface 508, which also may be referred to as top surface 508 of raised region 504 of substrate 502. Recessed region 505/recess 506 may include surfaces 510a and 510b. As an example, surface 510a may be considered a sidewall surface (as shown in FIG. 5B) and surface 510b may be considered a bottom surface. Surfaces 510a and 510b may be considered to be located below top surface 508 of substrate 502.

Substrate 502 can be of any suitable material, such as organic hardmasks, oxides, nitrides, dielectrics, barrier materials, or conducting materials. In a particular example, substrate 302 includes silicon, silicon dioxide, silicon nitride, and/or silicon oxynitride.

A hardmask 512 has been deposited on substrate 502. In certain embodiments, hardmask 512 is a spin-on carbon or other organic material that has been deposited using a spin-coating technique. As examples, hardmask 512 may include a resist layer, a spin-on carbon layer, an amorphous carbon layer (whether or not deposited using a spin-on deposition process), a silicon nitride layer, a silicon dioxide layer, a metal-containing layer, or any other suitable type of hardmask. Although this disclosure primarily describes hardmask 512 being a particular material deposited using a particular technique, this disclosure contemplates hardmask 512 being including any suitable material and being deposited using any suitable technique. Furthermore, although described as a hardmask, hardmask 512 could be a resist or other suitable type of layer.

As shown in FIG. 5B, an etchback has been performed on hardmask 512, removing hardmask 512 over top surface 508 of raised region 504 of substrate 502, from a portion of surface 510a of recessed region 505 (such that at least a portion of hardmask 512 is located below top surface 508), and from a portion 511a of surface 510b of recessed region 505. The etchback of hardmask 512 is performed using any suitable combination of a wet solvent strip, a wet etch, a plasma etch, or a UV/O$_2$ treatment.

In certain embodiments, after performing the etchback of hardmask 512, semiconductor device 500 may be washed (e.g., using a solvent to remove oxidized surfaces resulting from the etchback of hardmask 512) to remove certain surface elements resulting from the etchback. In a particular example, the solvent used to wash semiconductor device 500 is N-butyl acetate; however, this disclosure contemplates using any suitable type of solvent.

As can be seen at indicator 515, after performing the etchback, a drop in hardmask 512 can occur, meaning that hardmask terminates earlier than intended and no longer has a planar (or generally planar) surface 513, which can cause problems with later fabrication steps.

Figure 5C:
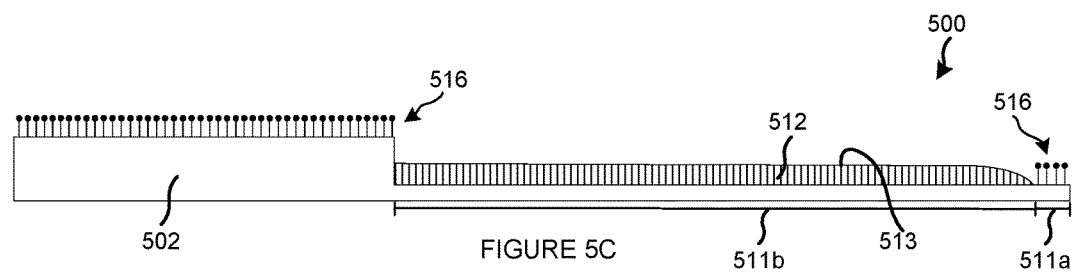
Figure 5D:
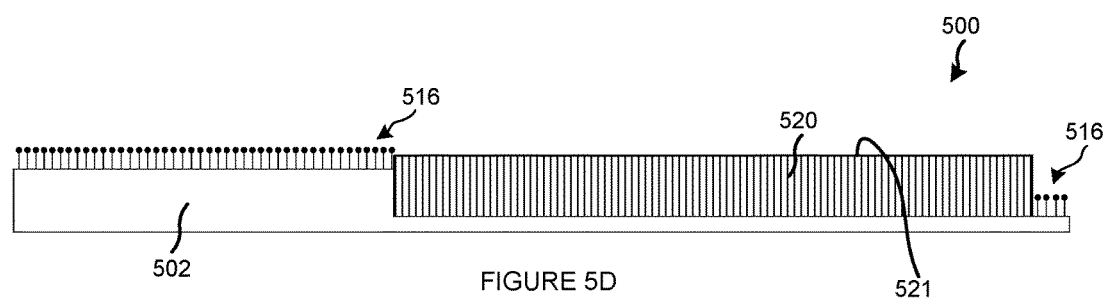

FIGS. 5C-5D illustrate stages of a process for depositing a planarizing film on substrate 502 in which a surface treatment is applied to selected surfaces of substrate 502 and in which recessed region 505/recess 506 are filled (partially or entirely) with a fill material. That is, rather than proceeding to depositing a planarizing film on substrate 502, a surface treatment is first applied to selected surfaces of substrate 502 and recessed region 505/recess 506 of substrate and then recessed region 505/recess 506 is filled (partially or entirely) with a fill material to provide an underlying topography that is more planar than the topography illustrated in FIG. 5B, for example.

In the illustrated example, as shown in FIG. 5C, a surface treatment 516 is applied to top surface 508 of substrate 502 and to a portion of surface 510b of recessed region 505. In certain embodiments, the portion of surface 510b of recessed region 505 to which surface treatment 516 is applied includes the entirety of portion 511a; however, surface treatment 516 may be applied to a different portion (e.g., less than portion 511a) of surface 510b of recessed region 505. In the illustrated example, surface treatment 516 is not applied to a surface 513 of hardmask 512.

Surface treatment 516 generally corresponds to surface treatment 416 described above with reference to FIGS. 4A-4E, although surface treatment 516 may be tuned to the particular substrate 502 and fill material used for the process described with reference to FIGS. 5A-5E. Surface treatment 516 creates surface condition 316, a condition in which a surface having surface condition 316 (e.g., top surface 508 and portion 511a of surface 510b) tends to repel or otherwise direct certain fill materials, such as the particular fill material to be deposited in FIG. 5D, away from the surface having surface condition 316. In a dewetting state, the surface contact angle may be matched for optimum solute/solvent dewetting for a particular fill material, such as the fill material to be deposited in FIG. 5D.

Surface 513 of hardmask 512 in recessed region 505 may have a surface condition analogous to surface condition 318, which, as described above, in which a surface having surface condition 318 (e.g., surface 513 of hardmask 512) tends to bond with or even attract certain fill materials, such as the particular fill material to be deposited in FIG. 5D, to the surface having surface condition 318. In a wettable state, the surface contact angle may be matched for optimum solute/solvent wettability for a particular fill material, such as the fill material to be deposited in FIG. 5D.

In certain embodiments, surface treatment 516 is a SAM deposited to create surface condition 316 for surfaces on which the SAM is deposited. For example, to provide selected surfaces of substrate 502 (e.g., top surface 508 of substrate 502 and portion 511a of surface 510b of recessed region 505) with surface condition 316, surface treatment 516 may be applied to surfaces of substrate 502 targeted to have surface condition 316. Surface treatment 516 creates a dewetting surface condition relative to a particular fill material (the fill material to be deposited in FIG. 5D) and may be deposited on top surface 508 of substrate 502 and portion 511a of surface 510b of recessed region 505 to direct the fill material away from the surfaces to which surface treatment 516 has been applied (top surface 508 of substrate 502 and portion 511a of surface 510b of recessed region 505).

In certain embodiments, applying surface treatment 516 to top surface 508 of substrate 502 and portion 511a of surface 510b of recessed region 505 includes depositing a SAM on top surface 508 of substrate 502 and portion 511a of surface 510b of recessed region 505. As a particular example, the SAM may be a liquid phase SAM. In certain embodiments, depending on the materials of substrate 502 (at exposed surfaces of substrate 502) and hardmask 512, surface treatment 516 (e.g., a SAM) is specific to an oxide, nitride, or other suitable material.

Although described as a monolayer, one of skill in the art will appreciate that complete coverage of surface treatment 516 might or might not be achieved and that aspects of this disclosure might still be accomplished. In other words, perfect alignment of the SAM (or other suitable surface treatment) is not required, as solute/solvent dewetting can occur without complete monolayer alignment. A given surface-selective monolayer has a terminal molecular group designed to cause dewetting of the spun on material. SAMs are described in greater detail below.

Surface treatment 516 may be applied in any suitable manner. In certain embodiments, surface treatment 516 is deposited through spin-on techniques. For example, a particular surface treatment 516 (e.g., SAM) may be deposited on selected surfaces (e.g., top surface 508 of substrate 502 and portion 511a of surface 510b of recessed region 505) of substrate 502. The applied surface treatment 516 may be selective to a particular underlying material, so that the surface treatment 516 is applied to particular surfaces and not others. For example, surface treatment 516 may be selective to the material of substrate 502, so that surface treatment 516 is deposited on top surface 508 of substrate 502 and portion 511a of surface 510b of recessed region 505 and not on surface 513 of hardmask 512.

As shown in FIG. 5D, fill material 520 is deposited in recessed region 505 over surface 513 of hardmask 512, surfaces to which surface treatment 516 has not been applied and which generally have a surface condition analogous to surface condition 318. As fill material 520 is deposited, surface treatment 516 of top surface 508 of substrate 502 and portion 511a of surface 510b of recessed region 505 directs fill material 520 to surface 513 of hardmask 512 and away from top surface 508 of substrate 502 and portion 511a of surface 510b to fill recessed region 505 over surface 513 of hardmask 512 with fill material 520 without adhering to surfaces to which surface treatment 516 has been applied. In certain embodiments, the combination of surface treatment 516 on selected surfaces (e.g., top surface 508 of substrate 502 and portion 511a of surface 510b of recessed region 505) and a lack of surface treatment 516 on other surfaces (e.g., surface 513 of hardmask 512) promotes deposition of fill material 520 over surface 513 of hardmask 512 in recessed region 505, without depositing fill material 520 on the selected surfaces of substrate 502.

Fill material 520 is generally analogous to fill material 320 and fill material 420, the details of which are incorporated by reference.

Furthermore, in certain embodiments, depending for example, on the topography of substrate 502, including the depth of recessed region 505 and the selected fill material 520 and associated deposition technique, one or multiple deposition steps may be executed until reaching a desired fill level.

Fill material 520 might or might not include the same material as hardmask 512. In certain embodiments, fill material 520 is deposited using a spin-on deposition process. As just one example, fill material 520 may be an organic material deposited using a spin-on deposition process, such as a spin-on carbon.

As shown in FIG. 5D, after deposition of fill material 520, fill material 520 may fill at least a portion of recessed region 505 and may have a top surface 521 that is substantially planar. Surface treatment 516 creates surface condition 316 for top surface 508 of substrate 502 and portion 511a of surface 510b of recessed region 505, directing fill material 520 to surface 513 of hardmask 512 in recessed region 505 without depositing fill material 520 on top surface 508 of substrate 502 and portion 511a of surface 510b of recessed region 505. Directing fill material 520 to surface 513 of hardmask 512 allows fill material 520 to reduce and potentially eliminate at least a portion of the drop in hardmask 512 that can occur over extended region, such as in recessed region 505.

In a particular example, with a SAM bonded to surfaces of substrate 502 (e.g., top surface 508 of substrate 502 and portion 511a of surface 510b of recessed region 505), a particular fill material 520 solute/solvent can be used for spin-on deposition. For spin-on deposition, the particular fill material 520 may be deposited on substrate 502, and substrate 502 may then be rotated to spread the particular fill material 520 across the surface of substrate 502, potentially evenly. With the SAM adhered to top surface 508 of substrate 502 and portion 511a of surface 510b of recessed region 505, top surface 508 and portion 511a of surface 510b have a surface energy that essentially repels the particular fill material 520. After spin-coating the particular fill material 520, the particular fill material 520 accumulates over surface 513 of hardmask 512, creating an approximately planar top surface 521, without being deposited on top surface 508 of substrate 502 and portion 511a of surface 510b of recessed region 505. The particular fill material 520 (e.g., a particular polymer) can be selected based on dewetting properties of a selected surface treatment 516 (e.g., SAM), or a particular surface treatment 516 (e.g., a particular SAM) can be selected based on a desired fill material 520 (e.g., a particular polymer).

In certain embodiments, fill material 520 accumulates over surface 513 of hardmask 512, creating a generally flat top surface 521. Deposited fill material 520 over surface 513 of hardmask 512 provides an improved (and potentially generally flat) surface for depositing a planarizing film in a subsequent deposition step rather than depositing the planarizing film on the varied topography of substrate 502 shown in FIGS. 5A-5B and over the drop in hardmask 512 shown at indicator 515 in FIG. 5B.

If appropriate, after deposition of fill material 520, a short etchback may be performed on fill material 520 to achieve a desired thickness and/or profile of fill material 520. In certain embodiments, the etchback of fill material 520, if executed, is performed using any suitable combination of a wet solvent strip, a wet etch, a plasma etch, or a UV/O$_2$ treatment.

Figure 5E:
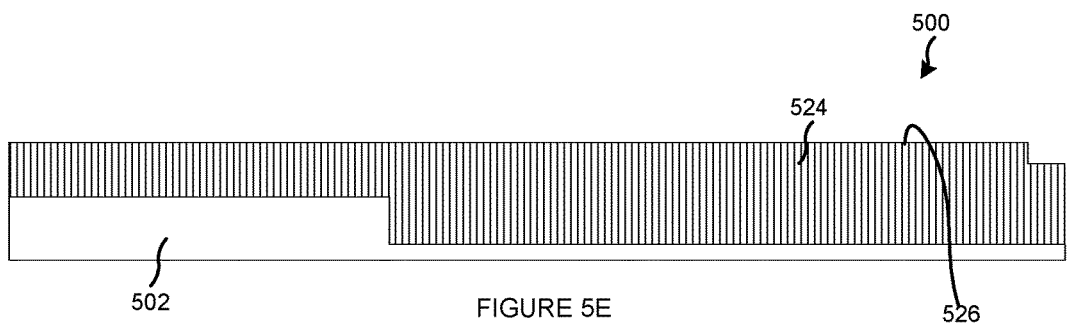

As shown in FIG. 5E, surface treatment 516 has been removed from semiconductor device 400 and a planarizing material 524 has been deposited. In certain embodiments, surface treatment 516 is removed, using one or more etch steps, by any suitable combination of a wet solvent strip, a wet etch, a plasma etch, or a UV/O$_2$ treatment. This disclosure contemplates any suitable type of removal process for removing surface treatment 516. The removal process used to remove surface treatment 516 leaves fill material 520 over surface 513 of hardmask 512. In certain embodiments, an etchant used in one or more etch steps to remove surface treatment 516 is selective to surface treatment 516, and does not etch (or etches only a minimal amount of) fill material 520. As a result, top surface 521 of fill material 520 retains its relatively planar characteristic.

After removal of surface treatment 516, both top surface 508 of substrate 502 and portion 511a of surface 510b of recessed region 505 return to a surface condition analogous to surface condition 318 (e.g., of FIG. 3D). That is, top surface 508 of substrate 502 and portion 511a of surface 510b of recessed region 505 may be considered wettable with respect to a planarizing film to be deposited (e.g., planarizing film 524).

As shown in FIG. 5E, a planarizing film 524 is deposited on substrate 502. The material of planarizing film 524 may be any suitable material. In certain embodiments, the material of planarizing film 524 is the same material as the material of fill material 520 (which also may be the same material as hardmask 512); however, this disclosure contemplates fill material 520 and planarizing film 524 including different materials. Due at least in part to the improved planarity of top surface 521 in FIG. 5D after fill material 520 has been deposited, a top surface 526 of planarizing film 524 has improved planarity.

Planarizing film 524 may be deposited in any suitable manner. In certain embodiments, planarizing film 524 is deposited using a spin-on deposition process. For example, planarizing film 524 may include an organic material. As a particular example, planarizing film 524 may be a spin-on carbon. Planarizing film 524 may be deposited to a desired thickness that is appropriate for a particular implementation.

With substrate 502 planarized, additional microfabrication steps can be executed. For example, following the deposition of planarizing film 524, which has improved planar characteristics, additional features of semiconductor device 500 may be formed in layers above or below planarizing film 524. As just a few examples, these features may include metal lines, vias, or other suitable features. Due to the improved planar characteristics of planarizing film 524, subsequently patterned features tend to have improved dimensional control and ultimately improved downstream yield.

Figure 6A:
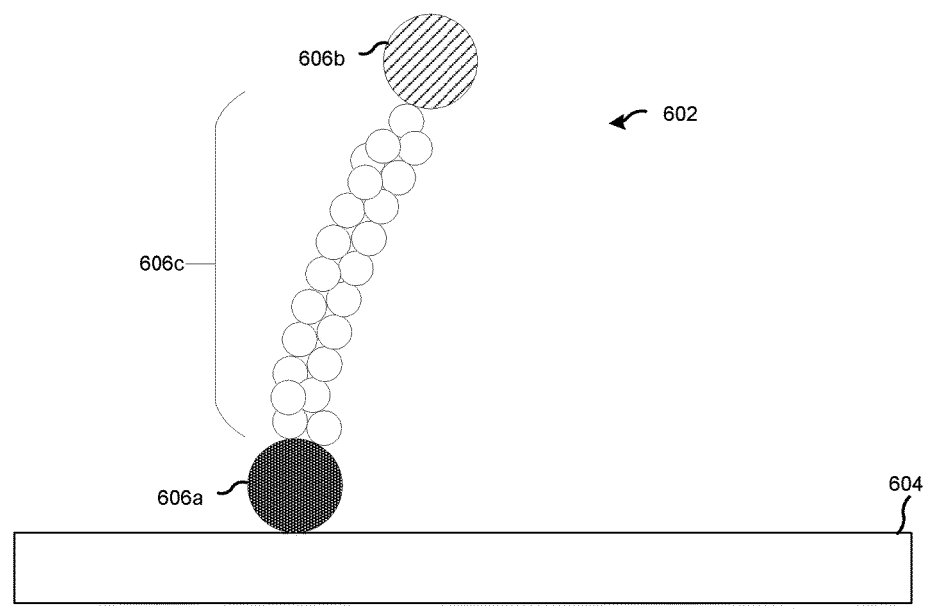
FIGS. 6A-6B illustrate example details of an example self-assembled monolayer, according to certain embodiments of this disclosure.
Figure 6B:
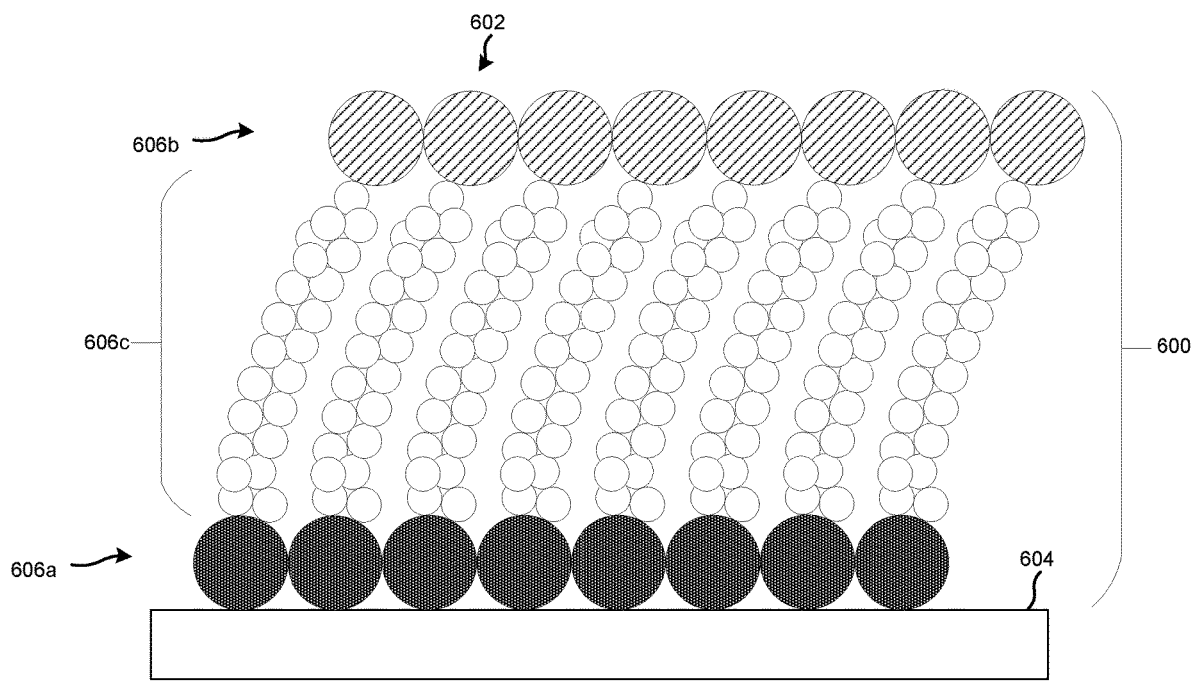

FIGS. 6A-6B illustrate example details of an example self-assembled monolayer (SAM) 600, according to certain embodiments of this disclosure. The embodiments described with reference to FIGS. 6A-6B are provided as examples only. This disclosure contemplates a SAM of any suitable structure and materials. As described above, surface treatment 416 and/or 516 may be implemented as a SAM, and SAM 600 provides an example of such a SAM.

FIG. 6A illustrates an example self-assembled monolayer (SAM) element 602 that is adhered to substrate 604. Substrate 604 could be, for example, substrate 302, substrate 402, hardmask 409, or substrate 502.

SAM element 602 includes three generalized functionality groups 606, a head group 606a, a functional group 606b, and a tail group 606c. In selecting the make-up of SAM element 602 (and thereby a SAM 600 that includes multiple SAM elements 602, as shown in FIG. 6B), the role of each of these generalized functionality groups 606 may be considered such that an appropriate selection is made.

Head group 606a, which also may be referred to as a ligand group, is adapted to adhere to substrate 604 to bond or otherwise adhere SAM element 602 to substrate 604. Thus, a material of head group 606a capable of and suitable for adhering to the material of substrate 604 may be selected for head group 606a.

Furthermore, the selection of a material for head group 606a (in combination with a selection of materials to which SAM 600 is intended to adhere and a selection of materials to which SAM 600 is not intended to adhere) promotes adhesion of SAM 600 to particular layers and not to other particular layers. For example, a head group 606a that is adapted to adhere to top surfaces 411 of hardmask 409 but that is not adapted to adhere to surfaces 410 of substrate 402 in recesses 406 may be selected. As another example, a head group 606a may be selected that is adapted to adhere to top surface 508 of raised region 504 of substrate 502 and to portion 511a of surface 510b of recessed region 505 of substrate 502, but that is not adapted to adhere to surfaces 513 of hardmask 512. This feature of head group 606a allows for selective deposition of SAM 600.

In particular examples, head group 606a may include a thiol-containing head group (e.g., octadecanethiol (ODT)) or a silicon-containing head group (e.g., octadecyltrichlorosilane (OTS) or Octadecylsiloxane (ODS)). In certain embodiments, to attach to an organic-containing substrate (e.g., spin-on carbon or amorphous carbon), head group 606a may include alkene-containing molecules, which can form a covalent bond with C—H terminated surface sites of a substrate layer. In certain embodiments, to attach to a silicon-containing substrate (e.g., Si, $SiO_2$, SiN, or SiON), head group 606a may include silicon and may be, for example, OTS or ODS. In certain embodiments, to attach to a metal-containing substrate (e.g., copper, cobalt, ruthenium, or another suitable metal), head group 606a may be a thiol-containing head group, such as ODT.

Functional group 606b, which also may be referred to as a terminal group, is designed to optimize the surface condition 316 (e.g., a dewetting surface condition) provided by SAM 600.

Tail group 606c, which also may be referred to as a spacer, couples head group 606a to functional group 606b and provides a desired spacing between head group 606a and functional group 606b. Furthermore, the length of tail group 606c can be tuned to adjust the contact angle for a particular material (e.g., fill material 320, 420, or 520). In certain embodiments, tail group 606c is a chain of molecules, such as an alkane chain. Tail group 606c may be an organic interphase, and may provide a well-defined thickness of SAM 600, act as a physical barrier, and alter electrical conductivity and local optical properties, if appropriate.

Tail group 606c may be optimized for a fill material to be deposited (e.g., fill material 320, 420, or 520). For example, in the case of a fill material to be deposited using a spin-on coating technique, tail group 606c may be optimized for the spin-on solvent associated with the spin-on coating technique to be used. As particular examples, carbon-containing or fluorine-containing tail groups may be used. For organic spin-on polymers, the choice of solvent may be particularly important. For example, low vapor pressure and high contact angle may be effective. As a particular example, toluene may be effective.

FIG. 6B illustrates a SAM 600 formed from multiple SAM elements 602 adhered to a surface of a substrate 604.

Figure 7:
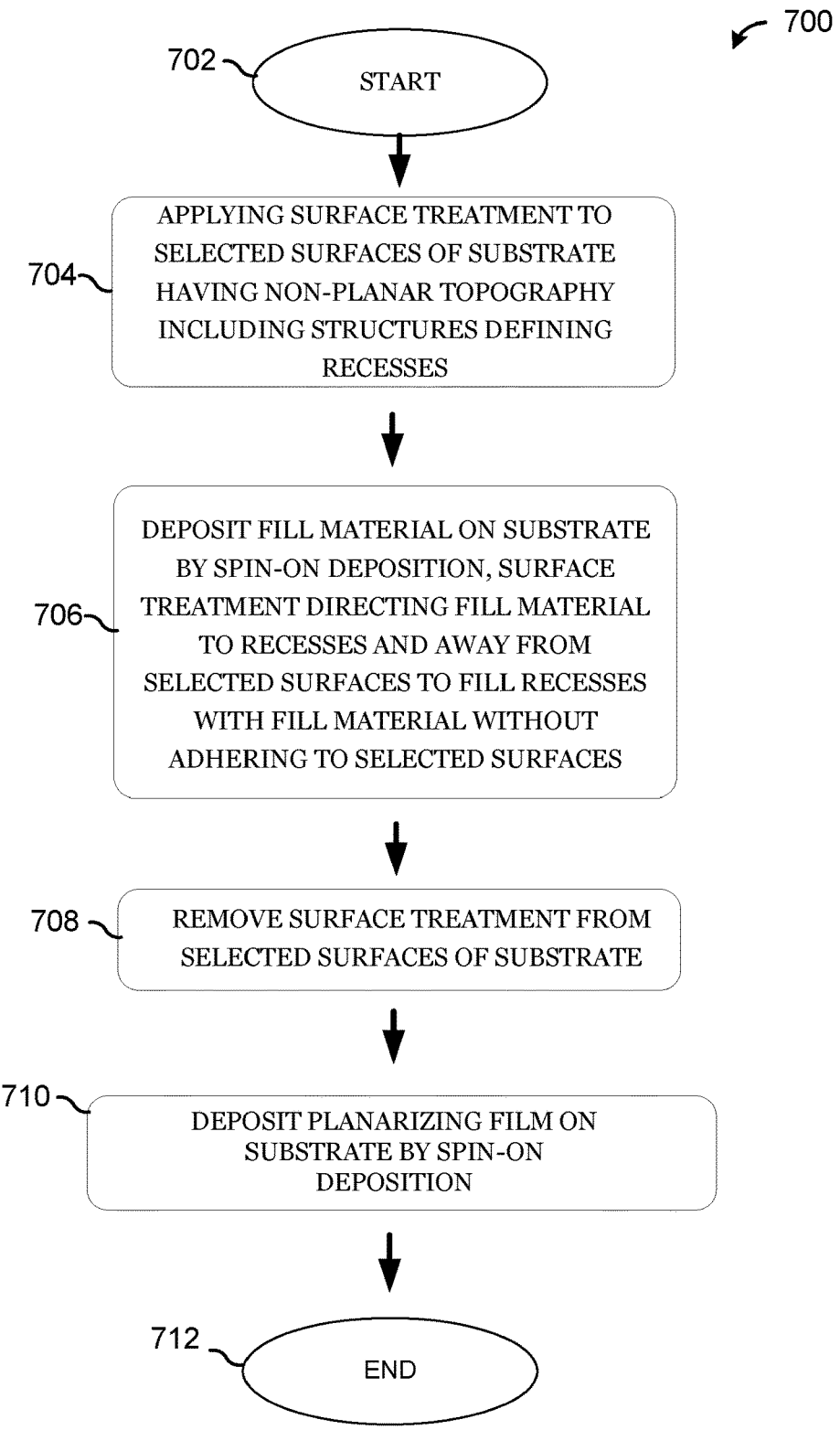
FIG. 7 illustrates an example method for forming a semiconductor device, according to certain embodiments of this disclosure.

FIG. 7 illustrates an example method 700 for forming a semiconductor device, according to certain embodiments of this disclosure. Embodiments of method 700 could be applied to any of the embodiments described in this disclosure, as well as other suitable embodiments. The method begins as step 702.

At step 704, a surface treatment is applied to selected surfaces on a substrate that has a non-planar topography that includes structures defining recesses. For example, the substrate may be substrate 302, which includes structures 304 defining recesses 306, and the selected surfaces may be top surfaces 308 of substrate 302. As another example, the substrate may be substrate 402, which includes structures 404 defining recesses 406, and the selected surfaces may be top surfaces 411 of hardmask 409, which may be considered top surfaces of substrate 402. As yet another example, the substrate may be substrate 502, which includes raised region 504 and recessed region 505, and a selected surface may be top surfaces 508 of substrate 502. With respect to substrate 502, over the area of a particular wafer, substrate 502 may include multiple raised regions 504 defining respective recesses 506. In certain embodiments, applying the surface treatment at step 704 includes depositing a SAM to the selected surfaces of the substrate.

At step 706, a fill material is deposited on the substrate, by spin-on deposition for example. The surface treatment directs the fill material to the recesses and away from the selected surfaces to fill the recesses with the fill material without adhering to the selected surfaces.

For example, as described above with reference to FIGS. 3A-3E, fill material 320 may be deposited on substrate 302, by spin-on deposition for example, and the surface treatment that creates surface condition 316 (e.g., a dewetting surface condition with respect to fill material 320) directs fill material 320 to recesses 306 and away from top surfaces 308 of substrate (to which the surface treatment that creates surface condition 316 has been applied) to fill recesses 306 without adhering to top surfaces 308 of substrate 302.

As another example, as described above with reference to FIGS. 4A-4E, surface treatment 416 creates a condition analogous to surface condition 316 (e.g., a dewetting surface condition with respect to fill material 420) and directs fill material 420 to recesses 406 and away from top surfaces 411 of hardmask 409 (to which surface treatment 416 has been applied) to fill recesses 406 without adhering to top surfaces 411 of hardmask 409.

In certain embodiments, such as described above with reference to FIGS. 5A-5E, prior to applying surface treatment 516 to selected surfaces of substrate 502 at step 704, hardmask 512 may be deposited on substrate 502, and hardmask 512 may be etched to remove hardmask 512 over the selected surfaces of substrate 502 and from a portion of recess 506 (of recessed region 505), a portion of hardmask 512 remaining in recess 506 (of recessed region 505). Depositing fill material 520 on substrate 502 by spin-on deposition may include depositing fill material 520 on the portion of the hardmask 512 remaining in recess 506 (of recessed region 505).

At step 708, the surface treatment is removed from the selected surfaces of the substrate. The surface treatment may be removed by any suitable combination of a wet solvent strip, a wet etch, a plasma etch, or a UV/O$_2$ treatment. For example, the surface treatment that creates surface condition 316 may be removed from top surfaces 308 of substrate 302, surface treatment 416 (and possibly hardmask 409) may be removed from top surfaces 411 of hardmask 409, or surface treatment 516 may be removed from top surface 508 of substrate 502 and from portion 511a of surface 510b of recess 506.

At step 710, a planarizing film is deposited on the substrate, by spin-on deposition for example. The planarizing film is deposited on the selected surfaces of the substrate and on top surfaces of the fill material. For example, planarizing film 324, 424, or 524 may be deposited on substrate 302 (including on top surfaces 308 of substrate 302 and top surface 322 of fill material 320 in recesses 306), on substrate 402 (including on top surfaces 408 of substrate 402 and top surface 422 of fill material 420 in recesses 406), or (on substrate 502 (including on top surface 508 of substrate 502 and top surface 521 of fill material 520 in recess 506), respectively.

Following the deposition of planarizing film, which has improved planar characteristics, additional features of the semiconductor device may be formed in layers above or below the planarizing film. As just a few examples, these features may include metal lines, vias, or other suitable features. Due to the improved planar characteristics of the planarizing film, subsequently patterned features tend to have improved critical dimension control and ultimately improved downstream yield.

At step 712, method 700 ends.

Figure 8:
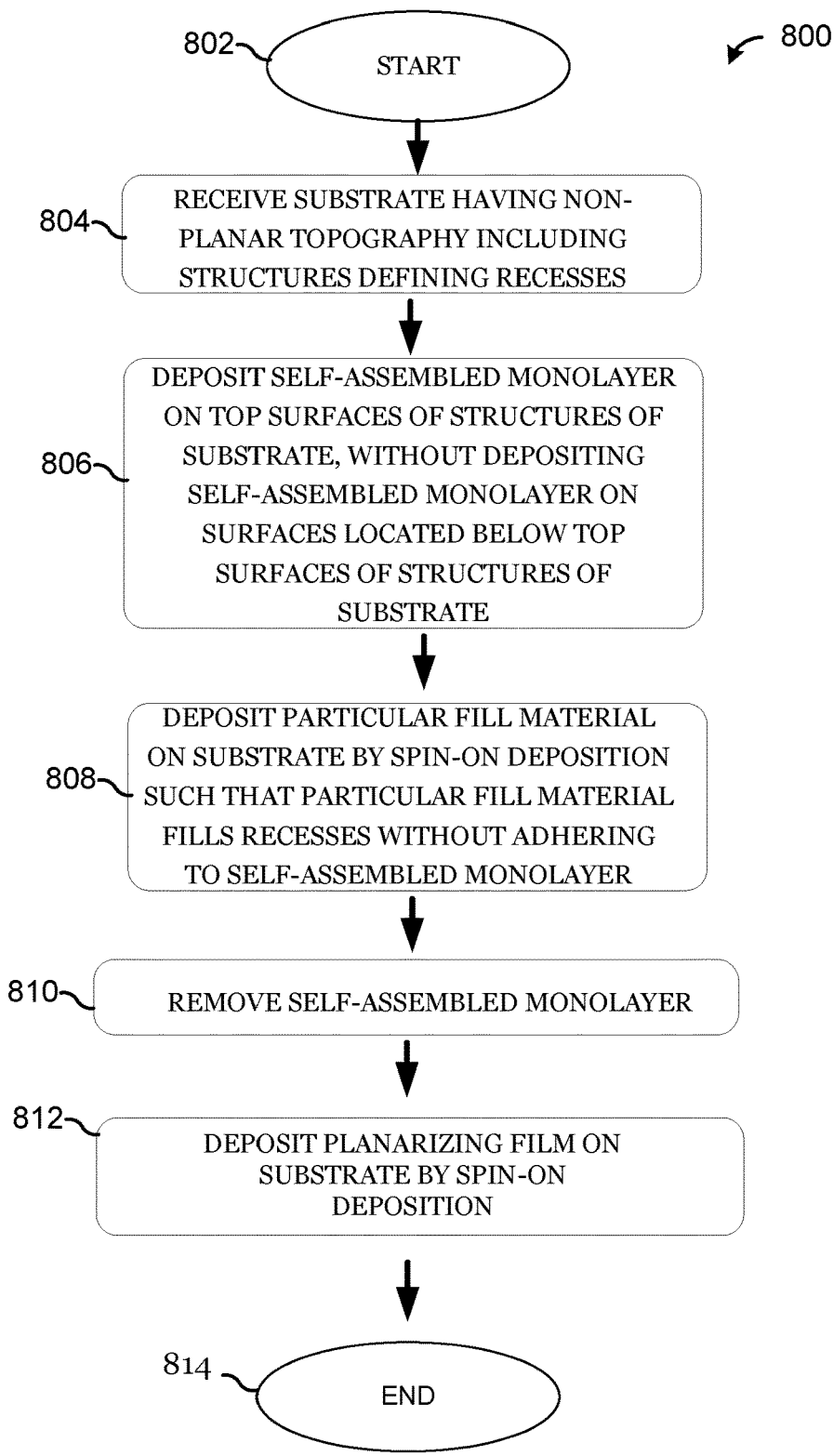
FIG. 8 illustrates an example method for forming a semiconductor device, according to certain embodiments of this disclosure.

FIG. 8 illustrates an example method 800 for forming a semiconductor device, according to certain embodiments of this disclosure. Embodiments of method 800 could be applied to any of the embodiments described in this disclosure, as well as other suitable embodiments. The method begins as step 802.

At step 804, a substrate having a non-planar topography including structures defining recesses is received. In certain embodiments, the substrate is received in a tool designed for depositing a surface treatment on selected surfaces of the substrate in a subsequent step. For example, the substrate may be substrate 302 (including structures 304 defining recesses 306), substrate 402 (including structures 404 defining recesses 406), or substrate 502 (including raised region 504 and recessed region 505). Regarding substrate 502, over the area of a particular wafer, substrate 502 may include multiple raised regions 504 defining respective recessed regions 505/recesses 506. In certain embodiments, portions of the substrate include a hardmask such that top surfaces of the portions of the substrate are the hardmask, as shown in FIG. 4A with hardmask 409 on substrate 402.

At step 806, a self-assembled monolayer (SAM) is deposited on top surfaces of the structures of the substrate, without depositing the SAM on surfaces located below the top surfaces of the structures of the substrate. For example, the surface treatment that provides surface condition 316 (e.g., a SAM) may be deposited on top surfaces 308 of substrate 302; surface treatment 416 (e.g., a SAM) may be deposited on top surfaces 411 of hardmask 409, which may be considered top surfaces of substrate 402; or surface treatment 516 (e.g., a SAM) may be deposited on top surface 508 of substrate 502, and potentially on other surfaces of substrate 502, such as portion 511a of surface 510b of recessed region 505. In certain embodiments, the SAM provides a dewetting surface condition (e.g., surface condition 316) for a particular fill material (e.g., fill material 320, 420, or 520), such as the fill material to be deposited at step 808. In certain embodiments, the SAM includes a head group (e.g., head group 606a) coupled to the substrate, a functional group (functional group 606b), and a tail group (e.g., tail group 606c) that couples the head group to the functional group such that that head group is spaced apart from the functional group.

At step 808, the particular fill material is deposited on the substrate, by spin-on deposition for example, such that the particular fill material fills the recesses without adhering to the SAM.

For example, as described above with reference to FIGS. 3A-3E, fill material 320 may be deposited on substrate 302, by spin-on deposition for example, and the surface treatment that creates surface condition 316 (e.g., a dewetting surface condition with respect to fill material 320) directs fill material 320 to recesses 306 and away from top surfaces 308 of substrate (to which the surface treatment that creates surface condition 316 has been applied) to fill recesses 306 without adhering to the surface treatment that creates surface condition 316. As another example, as described above with reference to FIGS. 4A-4E, surface treatment 416 (e.g., a SAM) creates a condition analogous to surface condition 316 (e.g., a dewetting surface condition with respect to fill material 420) and directs fill material 420 to recesses 406 and away from top surfaces 411 of hardmask 409 (to which surface treatment 416 has been applied) to fill recesses 406 without adhering to surface treatment 416.

In certain embodiments, as described with respect to FIGS. 5A-5E for example, prior to depositing the SAM (surface treatment 516) on the top surface (surface 508) of the structures of the substrate (raised region 504 of substrate 502) at step 806, a hardmask 512 may be deposited on substrate 502 and hardmask 512 may be etched to remove hardmask 512 over the top surface (surface 508) of the structures of the substrate (raised region 504 of substrate 502) and from a portion of recessed region 505/recess 506, a portion of hardmask 512 remaining in recessed region 505/recess 506. Depositing fill material 520 on substrate 502 by spin-on deposition such that fill material 520 fills recess 506 (of recessed region 505) without adhering to surface treatment 516 (e.g., a SAM) may include depositing fill material 520 on the portion of hardmask 512 remaining in recess 506 (of recessed region 505).

At step 810, the SAM is removed. For example, the SAM may be removed by any suitable combination of a wet solvent strip, a wet etch, a plasma etch, or a UV/O$_2$ treatment. For example, as described above with reference to FIGS. 3A-3E, the surface treatment (e.g., a SAM) that creates surface condition 316 is removed from top surfaces 308 of substrate 302. As another example, as described above with reference to FIGS. 4A-4E, surface treatment 416 (e.g., a SAM) is removed from top surfaces 411 of hardmask 409. In certain embodiments, step 810 includes removing hardmask 409. As another example, as described above with reference to FIGS. 5A-5E, surface treatment 516 (e.g., a SAM) is removed from top surface 508 of substrate 502 and from portion 511a of surface 510b of recess 506 (of recessed region 505).

At step 812, a planarizing film is deposited on the substrate, by spin-on deposition for example. The planarizing film is deposited on the top surfaces of the structures and on top surfaces of the particular fill material that fills the recesses. For example, planarizing film 324 may be deposited on substrate 302 (including on top surfaces 308 of substrate 302 and top surface 322 of fill material 320 in recesses 306), planarizing film 424 may be deposited on substrate 402 (including on top surfaces 408 of substrate 402 and top surface 422 of fill material 420 in recesses 406), or planarizing film 524 may be deposited on substrate 502 (including on top surface 508 of substrate 502 and top surface 521 of fill material 520 in recess 506 (of recessed region 505)).

Following the deposition of planarizing film, which has improved planar characteristics, additional features of the semiconductor device may be formed in layers above or below the planarizing film. As just a few examples, these features may include metal lines, vias, or other suitable features. Due to the improved planar characteristics of the planarizing film, subsequently patterned features tend to have improved critical dimension control and ultimately improved downstream yield.

At step 814, method 800 ends.

Figure 9:
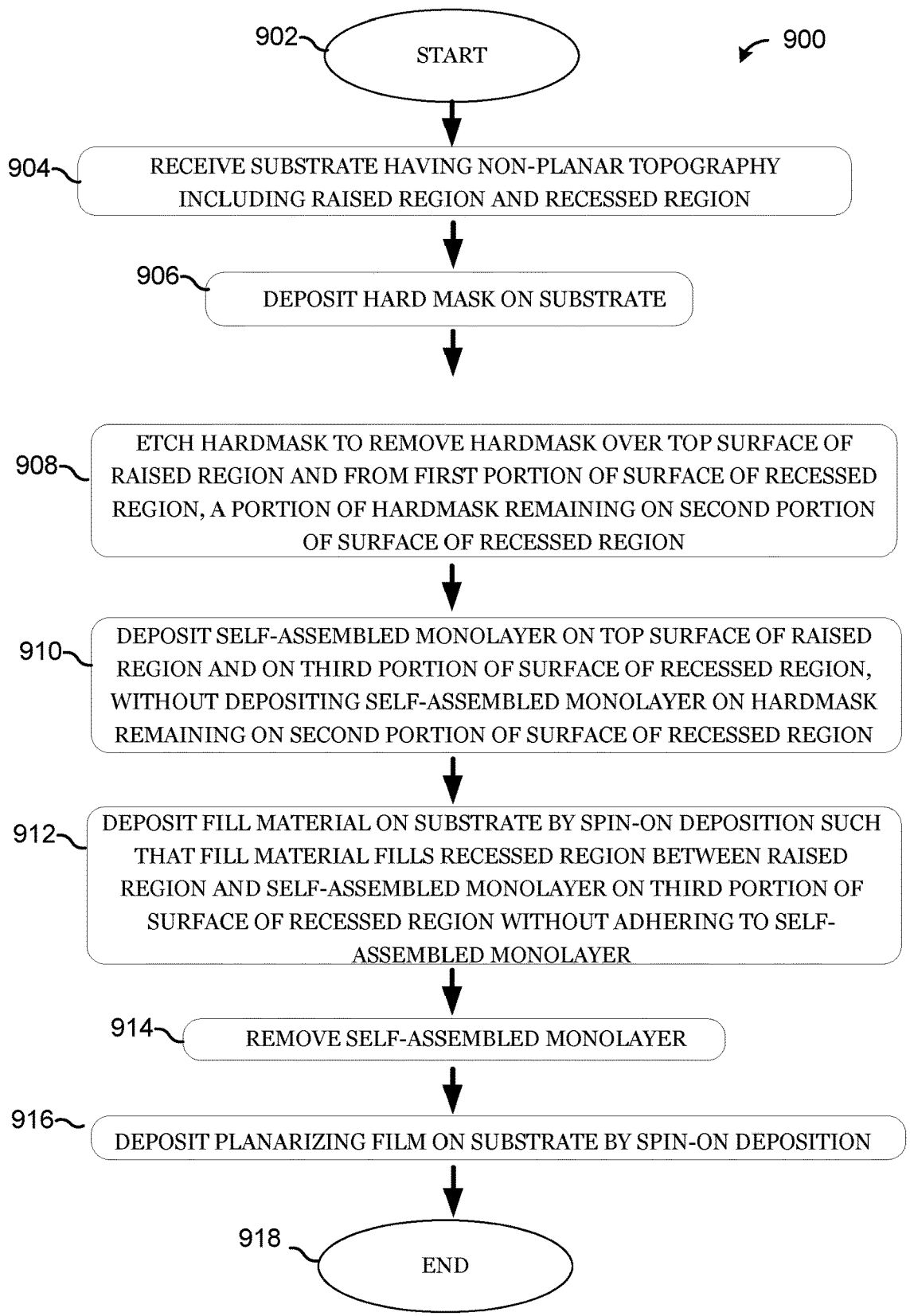
FIG. 9 illustrates an example method for forming a semiconductor device, according to certain embodiments of this disclosure.

FIG. 9 illustrates an example method 900 for forming a semiconductor device, according to certain embodiments of this disclosure. Embodiments of method 900 could be applied to any of the embodiments described in this disclosure, as well as other suitable embodiments. In this particular example, method 900 is described with reference to semiconductor device 500 of FIGS. 5A-5E. The method begins as step 902.

At step 904, substrate 502 having a non-planar topography including a raised region 504 and a recessed region 505 is received. For example, substrate 502 may be received in a tool for depositing a hardmask in a subsequent step, such as a spin-coating tool.

At step 906, hardmask 512 may be deposited on substrate 502.

At step 908, hardmask 512 is etched to remove hardmask 512 over top surface 508 of raised region 504 of substrate 502 and from a portion 511a of a surface 510b of recessed region 505. A portion of hardmask 512 remains on a portion 511b of surface 510b of recessed region 505. In certain embodiments, the etch performed on hardmask 512 at step 908, which may be referred to as an etchback, also removes hardmask 512 from a portion of surface 510a of recessed region 505, such that at least a portion of hardmask 512 is located below top surface 508 of substrate 502. In certain embodiments, the etch of hardmask 512 is performed using any suitable combination of a wet solvent strip, a wet etch, a plasma etch, or a UV/O$_2$ treatment.

At step 910, a SAM (or other surface treatment 516) is deposited on top surface 508 of raised region 504 and on portion 511a (or another suitable portion) of surface 510b of recessed region 505, without depositing the SAM (or other surface treatment 516) on hardmask 512 remaining on portion 511b of surface 510b of recessed region 505. The SAM (or other surface treatment 516) provides a dewetting surface condition (e.g., analogous to surface condition 316) for a fill material, such as fill material 520.

At step 912, fill material 520 is deposited on substrate 502, by spin-on deposition for example, such that fill material 520 fills recessed region 505 between raised region 504 and the SAM (or other surface treatment 516) on portion 511a of surface 510b of recessed region 505 without adhering to the SAM. In certain embodiments, depositing fill material 520 on substrate 502 by spin-on deposition includes depositing fill material 520 on hardmask 512 remaining in recess region 505.

At step 914, the SAM (or other surface treatment 516) is removed in one or more removal steps. This disclosure contemplates any suitable type of removal process for removing surface treatment 516, including any suitable combination of a wet solvent strip, a wet etch, a plasma etch, or a UV/O$_2$ treatment. The removal process used to remove surface treatment 516 leaves fill material 520 over surface 513 of hardmask 512. In certain embodiments, an etchant used in one or more etch steps to remove surface treatment 416 and hardmask 409 is selective to surface treatment 516, and does not etch (or etches only a minimal amount of) fill material 520. As a result, top surface 521 of fill material 520 retains its relatively planar characteristic.

At step 916, planarizing film 524 is deposited on substrate 502, by spin-on deposition for example. Planarizing film 524 may be deposited on top surface 508 of raised region 504 of substrate 502 and on top surface 521 of fill material 520. Due at least in part to the improved planarity of top surface 521 in FIG. 5D after fill material 520 has been deposited, a top surface 526 of planarizing film 524 has improved planarity. Details for planarizing film 524 are described above with reference to FIG. 5E.

Following the deposition of planarizing film 524, which has improved planar characteristics, additional features of the semiconductor device may be formed in layers above or below the planarizing film. As just a few examples, these features may include metal lines, vias, or other suitable features. Due to the improved planar characteristics of the planarizing film, these features also tend to have improved characteristics, such as improved critical dimension control and ultimately improved downstream yield.

At step 918, method 900 ends.

Embodiments of this disclosure may provide one or more technical advantages. For example, certain embodiments reduce or eliminate a lack of planarity in a planarizing film that is deposited over a substrate that has a varied topography. By partially or completely filling recesses in the substrate with a fill material, the variations in the substrate topography may be reduced or eliminated, resulting in a more thickness-controlled planarization film when deposited over the substrate. Furthermore, the fill material is be directed to the recesses by applying a surface treatment to selected surfaces of the substrate (e.g., top surfaces of the substrate) prior to depositing the fill material. Embodiments of this disclosure may provide some or all of these advantages.

Although this disclosure has been described primarily using particular types of substrates such as those similar to substrate 102, substrate 302, substrate 402, and substrate 502, this disclosure contemplates applying similar principles and techniques to planarize a topography of any suitable type of substrate. As just one particular example, embodiments of this disclosure could be applied to three-dimensional structures, such as substrate 202 of semiconductor device 200.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Throughout this disclosure, the terms "layer" and "film" may each include one or more layers or films deposited in one or more processing steps. "Substrate" or "target substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

The invention claimed is:

1. A method for planarizing a substrate for patterning with a lithography process, the method comprising:
receiving a substrate having a non-planar topography including structures defining recesses, the substrate comprising a hardmask;
depositing a self-assembled monolayer on top surfaces of the structures of the substrate, without depositing the self-assembled monolayer on surfaces located below the top surfaces of the structures of the substrate, the self-assembled monolayer providing a dewetting surface condition for a particular fill material, the particular fill material being a photoresist, a silicon-containing anti-reflective coating, or a spin-on organic carbon;
depositing the particular fill material on the substrate by spin-on deposition such that the particular fill material fills the recesses without adhering to the self-assembled monolayer;
removing the self-assembled monolayer;
removing the hardmask;
after removing the hardmask, forming a planar layer comprising a planarizing film, the forming comprising depositing the planarizing film, by spin-on deposition, over the top surfaces of the structures and top surfaces of the particular fill material, the planar layer having a planar surface.

2. The method of claim 1, wherein the top surfaces of portions of the substrate are the hardmask, the self-assembled monolayer being deposited on the hardmask.

3. The method of claim 1, wherein the planarizing film is a same material as the particular fill material.

4. The method of claim 1, wherein the hardmask is a spin-on carbon hardmask.

5. The method of claim 1, further comprising, prior to depositing the self-assembled monolayer on the top surfaces of the structures of the substrate:
depositing the hardmask on the substrate; and
etching the hardmask to remove the hardmask over the top surfaces of the structures and from a portion of the recesses, a portion of the hardmask remaining in the recesses.

6. The method of claim 5, wherein depositing the particular fill material on the substrate by spin-on deposition such that the particular fill material fills the recesses without adhering to the self-assembled monolayer comprises depositing the particular fill material on the portion of the hardmask remaining in the recesses.

7. The method of claim 1, wherein the self-assembled monolayer comprises:
a head group coupled to the substrate;
a functional group; and
a tail group coupling the head group to the functional group such that that head group is spaced apart from the functional group, the tail group being an organic substance.

8. The method of claim 1, wherein the self-assembled monolayer comprises thiol or silicon.

9. The method of claim 1, wherein the recesses include at least one of trenches or holes defined by the structures of the non-planar topography of the substrate.

10. The method of claim 1, wherein depositing the self-assembled monolayer is performed by a spin-on process.

11. The method of claim 1, wherein the removing of the self-assembled monolayer exposes the top surfaces of the structures, and the planarizing film physically contacts the exposed top surfaces of the structures.

12. The method of claim 1, wherein depositing the self-assembled monolayer is performed by a low temperature chemical vapor deposition process.

13. A method for processing a substrate, the method comprising:
    depositing a hardmask on the substrate, the substrate having top surfaces with a non-planar topography including structures defining recesses;
    etching the hardmask to remove the hardmask from top surfaces of the substrate and a portion of the recesses, a portion of the hardmask remaining in the recesses after the etching;
    applying a surface treatment to the top surfaces;
    depositing a fill material on the substrate by spin-on deposition, the surface treatment directing the fill material to fill the recesses with the fill material without adhering to the top surfaces;
    removing the surface treatment from the top surfaces; and
    depositing a planarizing film on the substrate by spin-on deposition, the planarizing film being deposited on the top surfaces and top surfaces of the fill material.

14. The method of claim 13, wherein the recesses include at least one of trenches or holes defined by the structures of the non-planar topography of the substrate.

15. The method of claim 13, wherein depositing the fill material on the substrate by spin-on deposition comprises depositing the fill material on the portion of the hardmask remaining in the recesses.

16. The method of claim 13, wherein applying the surface treatment comprises depositing a self-assembled monolayer on the top surfaces of the substrate.

17. A method for processing a substrate, the method comprising:
    receiving a substrate having a non-planar topography including a raised region and a recessed region;
    depositing a hardmask on the substrate;
    etching the hardmask to remove the hardmask over a top surface of the raised region and from a first portion of a surface of the recessed region, a portion of the hardmask remaining on a second portion of the surface of the recessed region;
    applying a surface treatment to the top surface of the raised region and to a third portion of the surface of the recessed region, without applying the surface treatment to the hardmask remaining on the second portion of the surface of the recessed region, the surface treatment providing a dewetting surface condition for a fill material;
    depositing the fill material on the substrate by spin-on deposition such that the fill material fills the recessed region between the raised region and the surface treatment applied to the third portion of the surface of the recessed region without adhering to the surface treatment;
    removing the surface treatment; and
    depositing a planarizing film on the substrate by spin-on deposition, the planarizing film being deposited on the top surface of the raised region and on a top surface of the fill material.

18. The method of claim 17, wherein the third portion of the surface of the recessed region comprises all of the first portion of the recessed region.

19. The method of claim 17, wherein the hardmask is a spin-on carbon hardmask.

20. The method of claim 17, wherein depositing the fill material on the substrate by spin-on deposition comprises depositing the fill material on the portion of the hardmask remaining on the second portion of the surface of the recessed region.

21. The method of claim 17, wherein applying the surface treatment to the top surface of the raised region and to the third portion of the surface of the recessed region comprises depositing a self-assembled monolayer on the top surface of the raised region and on the third portion of the surface of the recessed region, the self-assembled monolayer providing the dewetting surface condition for the fill material.

* * * * *